United States Patent
Hamatani et al.

(10) Patent No.: US 6,987,036 B2
(45) Date of Patent: Jan. 17, 2006

(54) METHOD FOR FORMING CRYSTALLINE SEMICONDUCTOR FILM AND APPARATUS FOR FORMING THE SAME

(75) Inventors: Toshiji Hamatani, Kanagawa (JP); Misako Nakazawa, Kanagawa (JP); Naoki Makita, Nara (JP)

(73) Assignees: Semiconductor Energy Laboratory Co., Ltd., Kanagawa-ken (JP); Sharp Kabushiki-ku Kaisha, Osaka (JP)

( * ) Notice: Subject to any disclaimer, the term of this patent is extended or adjusted under 35 U.S.C. 154(b) by 58 days.

(21) Appl. No.: 10/209,243

(22) Filed: Aug. 1, 2002

(65) Prior Publication Data
US 2003/0032267 A1 Feb. 13, 2003

(30) Foreign Application Priority Data
Aug. 1, 2001 (JP) ........................................ 2001-233820

(51) Int. Cl.
H01L 21/84 (2006.01)

(52) U.S. Cl. ........................................ 438/166; 438/168
(58) Field of Classification Search ................. 438/166, 438/398, 580, 762
See application file for complete search history.

(56) References Cited

U.S. PATENT DOCUMENTS

| 5,643,826 | A | 7/1997 | Ohtani et al. |
| 5,923,962 | A | 7/1999 | Ohtani et al. |
| 6,074,901 | A | 6/2000 | Ohtani et al. |
| 6,221,788 | B1 * | 4/2001 | Kobayashi et al. ......... 438/762 |
| 6,461,931 | B1 * | 10/2002 | Eldridge ..................... 438/398 |

FOREIGN PATENT DOCUMENTS

JP 07/211636 A 8/1995

* cited by examiner

Primary Examiner—Howard Weiss
Assistant Examiner—(Vikki) Hoa B. Trinh
(74) Attorney, Agent, or Firm—Nixon Peabody LLP; Jeffrey L. Costellia

(57) ABSTRACT

The invention is directed to a countermeasure against a local amorphous region observed as an eddy pattern on a thermally crystallized crystalline silicon film. The local amorphous region is thought to result from a deficiently formed ultra-thin silicon oxide film by ozone water treatment, which causes a local phenomenon of repelling a catalyst element solution during spin coating. This inhibits a uniform addition of a catalyst element. A relationship between an ozone concentration of ozone water and a wait time between the ozone water treatment and the subsequent step of adding the catalyst element is deduced and used for planning the countermeasure against the local amorphous region.

25 Claims, 13 Drawing Sheets

FIG. 3A (ozone concentration 1.3 mg/l)
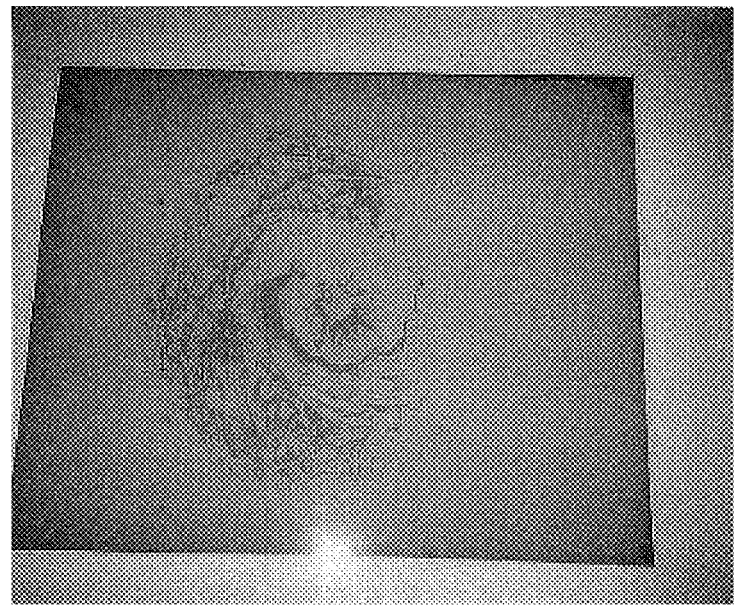
FIG. 3B (ozone concentration 2.0 mg/l)
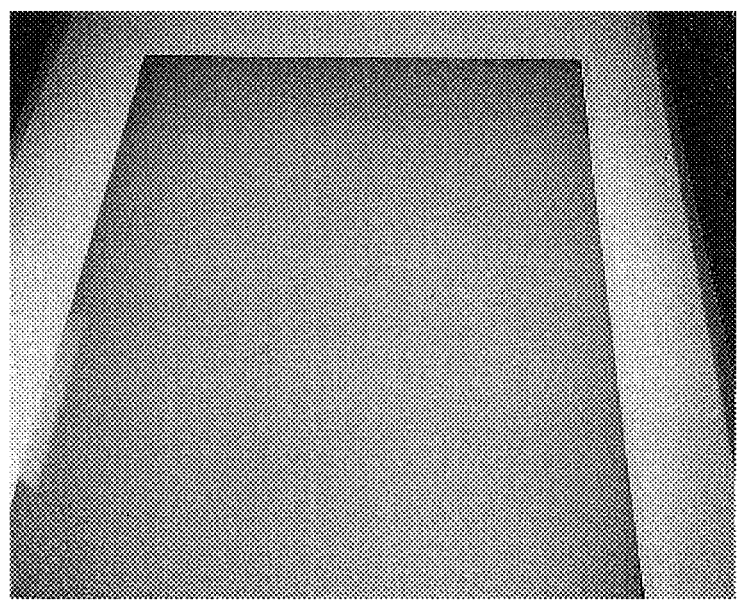

FIG. 4A

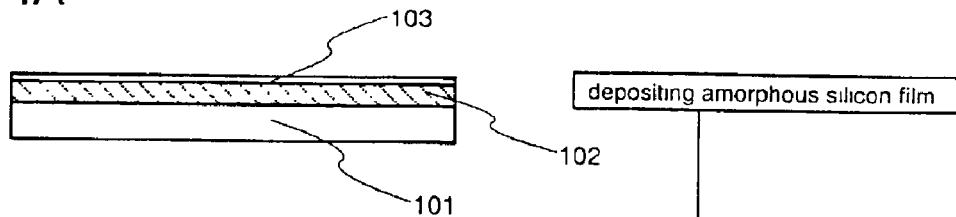

depositing amorphous silicon film

FIG. 4B

removing natural oxide film by dilute hydrofluoric acid

FIG. 4C

forming ultra-thin silicon oxide film by ozone water treatment

FIG. 4D

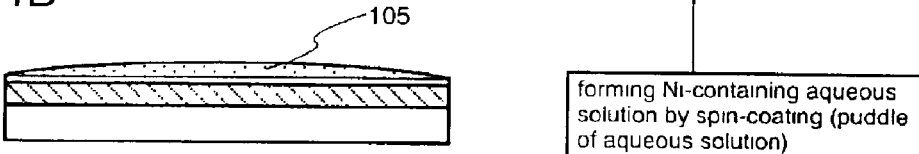

forming Ni-containing aqueous solution by spin-coating (puddle of aqueous solution)

FIG. 4E

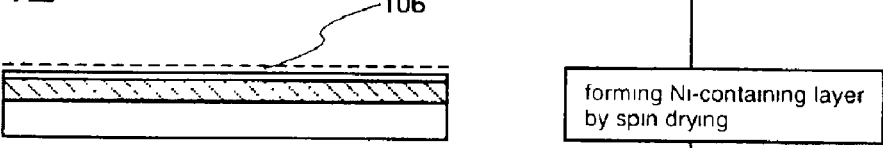

forming Ni-containing layer by spin drying

FIG. 4F

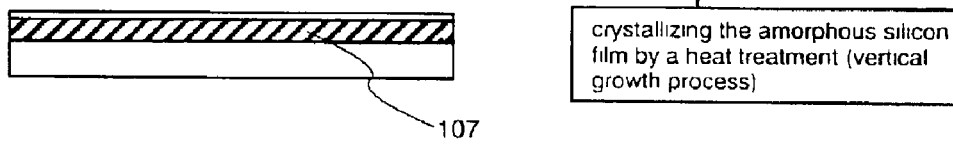

crystallizing the amorphous silicon film by a heat treatment (vertical growth process)

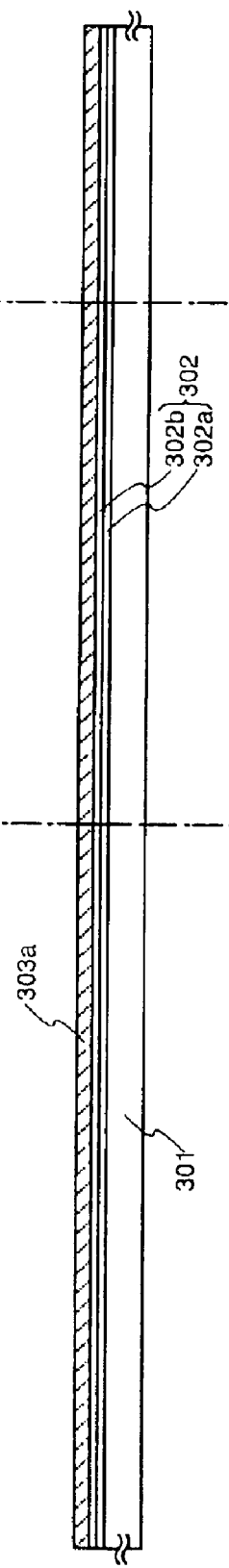
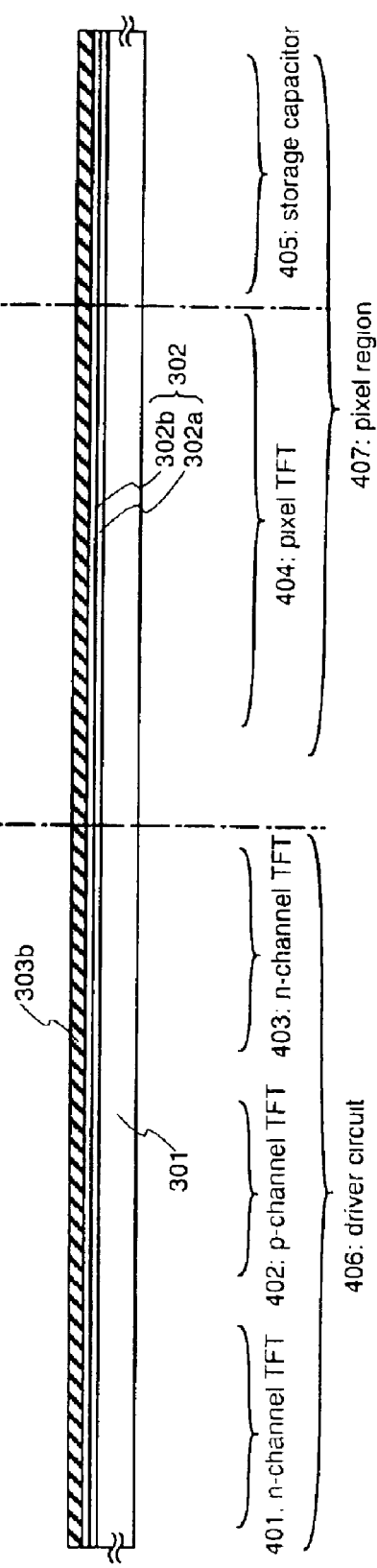
FIG. 6A
FIG. 6B

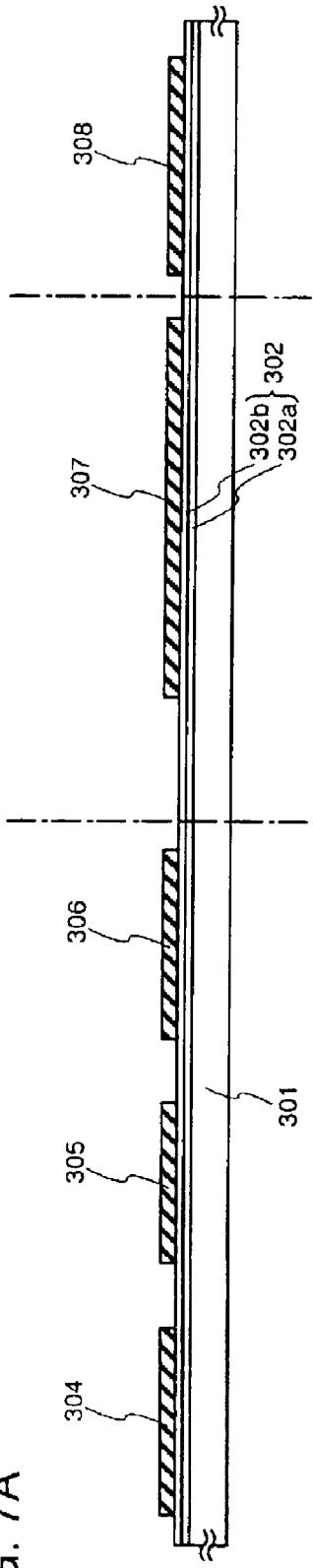
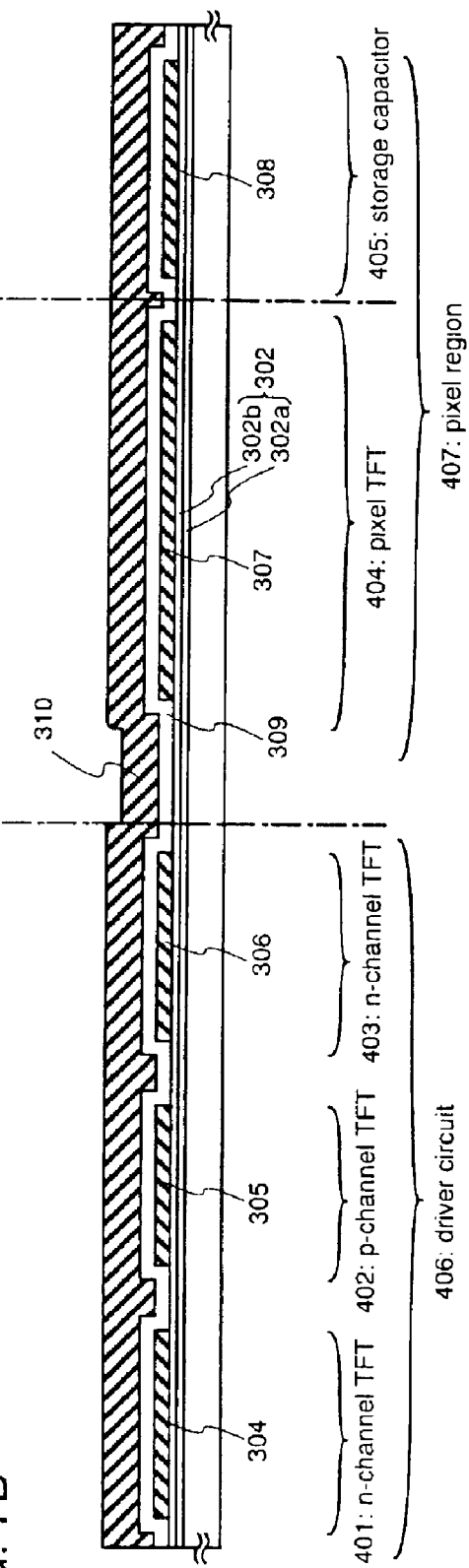
FIG. 7A
FIG. 7B

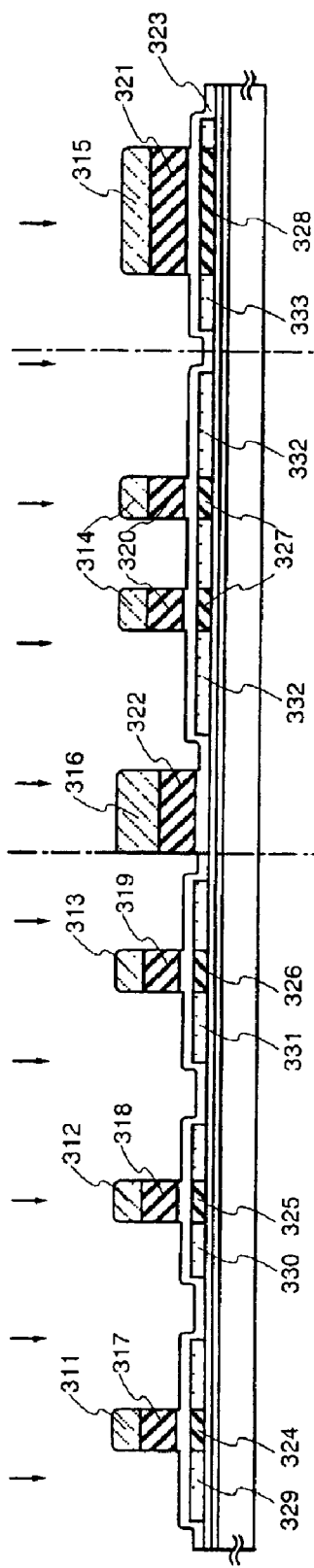
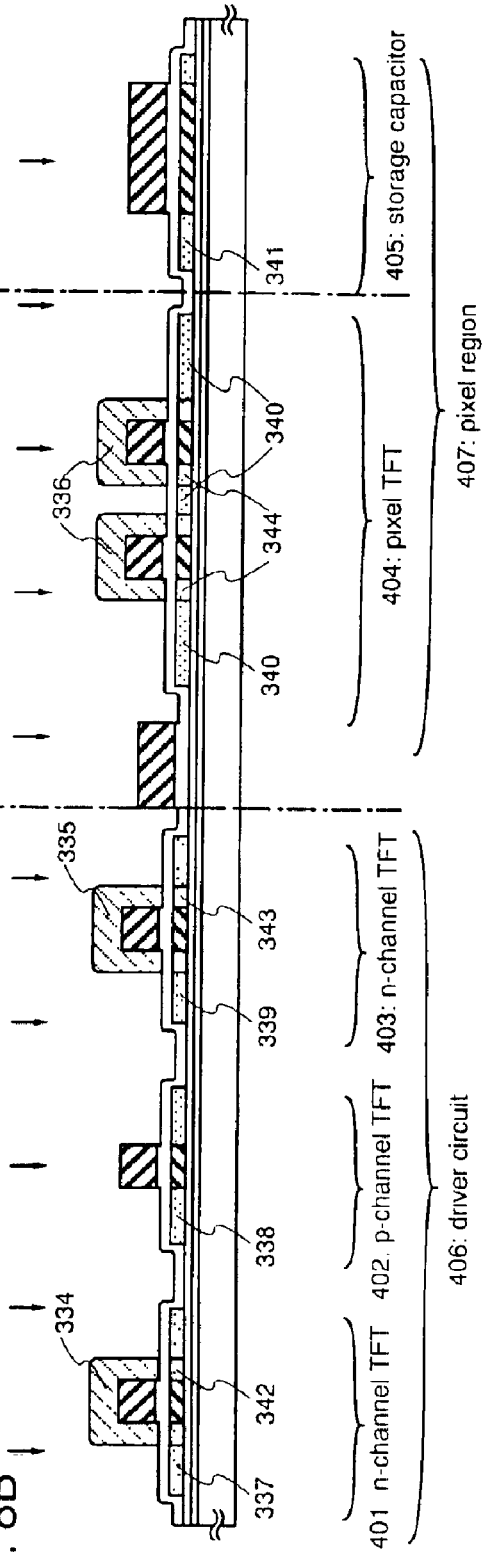

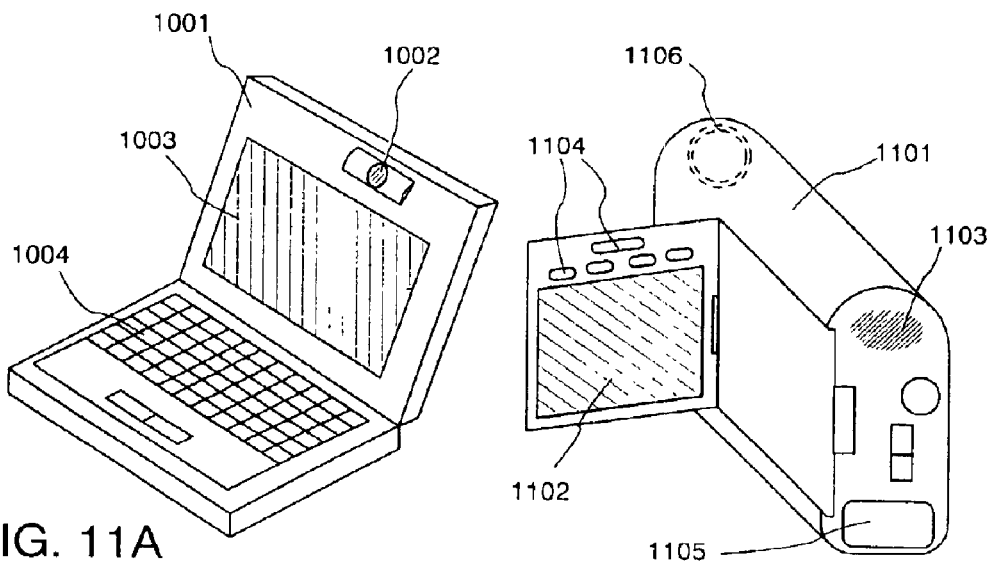
FIG. 11A
FIG. 11B
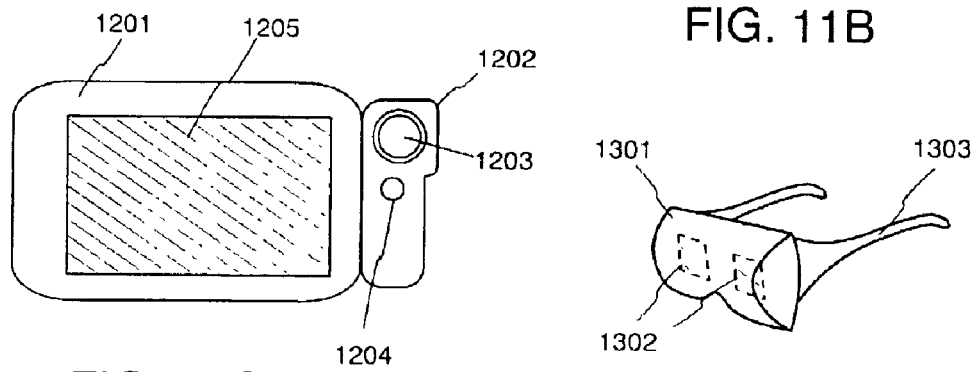
FIG. 11C
FIG. 11D
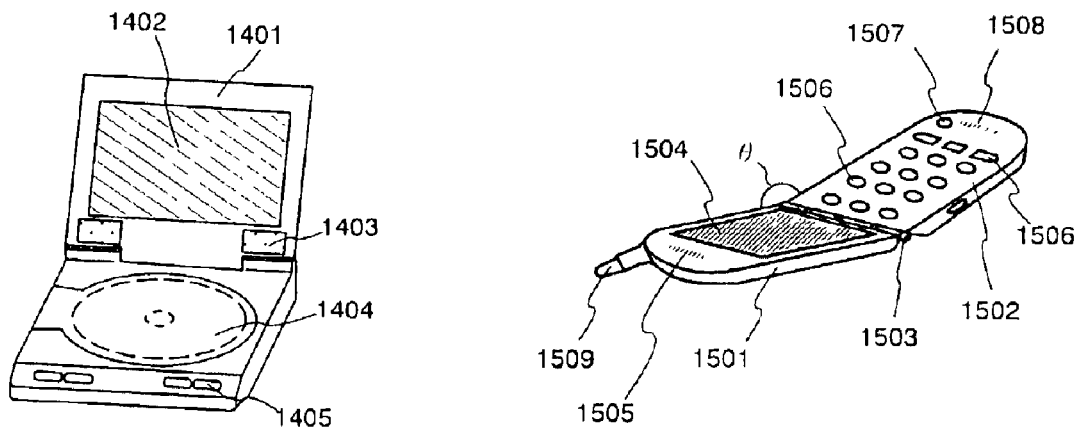
FIG. 11E
FIG. 11F

METHOD FOR FORMING CRYSTALLINE SEMICONDUCTOR FILM AND APPARATUS FOR FORMING THE SAME

BACKGROUND OF THE INVENTION

1. Field of the Invention

The present invention relates to a method for forming a silicon-containing crystalline semiconductor film applied to a semiconductor device such as Thin Film Transistors (hereinafter simply referred to as "TFT").

2. Description of the Prior Art

The recent years have seen a rapid advance of a technology wherein a semiconductor circuit is formed by constructing a TFT on an insulative substrate such as a glass substrate. The technology is used for fabricating electro-optical apparatus such as active-matrix liquid crystal displays. The active-matrix liquid crystal display means a monolithic liquid crystal display having a pixel matrix circuit and a driver circuit formed on the same substrate. The above technology is also used for the development of a System On Panel incorporating logic circuits including γ-compensation circuit, memory circuit, and clock generating circuit.

Since such driver circuit and logic circuits must provide high-speed performances, it is improper to apply an amorphous silicon film to a semiconductor film as an active layer of the TFT. Under the current circumstances, TFTs comprising a semiconductor layer of polycrystalline silicon film are becoming predominant. As to the substrate on which the TFT is formed, the use of the less costly glass substrate is demanded. Hence, the development of low temperature process applicable to the glass substrate has become brisk.

As the low temperature process techniques, there is known a technique including the steps of introducing a catalyst element effective to accelerate crystallization, such as nickel (Ni), into an amorphous silicon film, and performing heat treatment for formation of a crystalline silicon film. It is known that the crystallization can be accomplished by heat treatment at temperatures of 550 to 600° C., which are below the temperature resisted by the glass substrate. The crystallization technique requires the introduction of the catalyst element into the amorphous silicon film. Examples of a suitable introduction method include plasma CVD process, sputtering, evaporation, and spin coating.

A test was conducted on the plasma CVD process using a nickel element as a typical catalyst element for accelerating crystallization for examining the crystallization process of the amorphous silicon film. As a result, the following facts were found.

Fact 1: Where the nickel element is introduced into the amorphous silicon film by plasma CVD process, the nickel element has been introduced into a substantially deep portion of the amorphous silicon film before the heat treatment is performed.

Fact 2: In the crystallization, initial nuclei are generated from a surface of a region doped with the nickel element.

Fact 3: Where the nickel element is introduced into the amorphous silicon film by plasma CVD and the crystallized crystalline silicon film is irradiated with laser light, excessive nickel element is deposited on a surface of the crystalline silicon film.

It is inferred from these facts that all the nickel element doped by plasma CVD does not effectively work and that the nickel element present in a contact surface portion between the nickel element and the amorphous silicon film contributes to the low temperature crystallization.

Although the catalyst element for accelerating crystallization is necessary for the crystallization of the amorphous silicon film, it is preferred for the catalyst element to be present in minimum possible concentrations after the crystallization. For one reason, the catalyst element is essentially a metal element which forms a deep energy level in the resultant crystalline silicon film, trapping carriers. Hence, the catalyst element may adversely affect the electrical characteristics and reliability of a TFT if the TFT is constructed using the crystalline silicon film. For another reason, it is practically confirmed that the catalyst element present in the crystalline silicon film is segregated in the grain boundary. Thus, it is inferred that the catalyst element may be a causative factor for a sporadic increase in the OFF current of the TFT (current through the TFT in OFF state).

For the above reasons, it is required to uniformly introduce the catalyst element (e.g., nickel element) into the place near the surface of the amorphous silicon film in a range to permit the low temperature crystallization and at minimum possible concentrations. In principle, therefore, the catalyst element introduction method wherein the catalyst element enters deep into the amorphous silicon film is improper. On this account, the sputtering and vapor deposition processes, similarly to the plasma CVD process, are also considered to be improper.

In this connection, there has been developed a method for effectively introducing the catalyst element only into a place near the surface of the amorphous silicon film, wherein a solution containing a catalyst element (hereinafter, simply referred to as "catalyst element solution") is applied by spin coating. This method is disclosed in Japanese Patent Laid-Open No. 211636/1995. The spin coating method as a catalyst element adding technique set forth in the publication has the following features.

Feature 1: Control of the concentration of the catalyst element in the catalyst element solution provides an easy control of the amount of catalyst element to be added to the amorphous silicon film surface.

Feature 2: This permits the minimum amount of catalyst element required for crystallization to be easily added to the amorphous silicon film surface.

Feature 3: The assurance of the reliability and electrical stability of the semiconductor device dictates the need for reducing to minimum the amount of catalyst element present in the crystallized crystalline silicon film. In the case of spin coating, the minimum amount of catalyst element required for crystallization can be easily added by adjusting the concentration of the catalyst element of the catalyst element solution. This results in the prevention of excessive catalyst element introduction, advantageously assuring the reliability and electrical stability of the semiconductor device.

The spin coating of the catalyst element includes the steps of: applying dropwise a catalyst element solution onto a substrate surface thereby forming a solution puddle thereon; and spinning the substrate at high speed for throwing away the catalyst element solution so applied dropwise thereby adding a desired amount of catalyst element to the substrate surface. Having the above three merits, the spin coating process is an important technique which is now being studied for practical use. However, where the catalyst solution is directly applied to the amorphous silicon film surface, the catalyst solution has poor wettability with the amorphous silicon film, so that the catalyst element solution is repelled by the substrate surface. The solution repellency emerges in a case where the catalyst element solution is an aqueous solution (typically an aqueous solution of nickel acetate). It is understood that the repellency of the catalyst element solution by the substrate surface results from that a bonding force (hydrogen bond) linking together water molecules as solvent molecules is greater than a bonding force between constituent atoms of the substrate surface (silicon atoms) and the water molecules.

Two major countermeasures are contemplated against this problem. One is to change the solvent molecules from water molecules to molecules having a smaller bonding force such as organic molecules or otherwise to add a surface tension modifier (comprising organic molecules) to an aqueous solution as the solvent for decreasing the surface tension of a droplet of the aqueous solution. The other is to form a thin film over the substrate surface for producing a state where a bonding force between the thin film and the water molecules becomes greater than the bonding force linking together the water molecules. The former approach is fundamentally unfavorable because the surface tension modifier comprises organic molecules rich in carbon atoms, involving the likelihood that the carbon atoms as impurities may be captured in the crystalline silicon film in the subsequent thermal crystallization process.

Accordingly, the latter approach has been currently adopted wherein a silicon oxide film is formed on the surface of the amorphous silicon film. The method for forming the silicon oxide film may be a process for depositing the silicon oxide film by CVD and the like or a process for lightly oxidizing the amorphous silicon film surface (mild oxidation). If the silicon oxide film is great in thickness, the catalyst element added to the surface may be blocked by the silicon oxide film so as to be inhibited from effectively working in the crystallization of the amorphous silicon film. Hence, a demand exists for a silicon oxide film having enhanced wettability with the catalyst element solution and such a ultra-thin film as not to block the catalyst element.

A preferred method for forming such a ultra-thin silicon oxide film is a treatment using ozone water (also called hydroxyl radical water) in the light of throughput and convenience. The ozone water treatment has been practically used for improving the catalyst element solution in wettability with the amorphous silicon film. It is possible to form a ultra-thin silicon oxide film of not more than 5 nm in thickness over the amorphous silicon film surface by treating the amorphous silicon film surface with the ozone water for about 60 seconds. In the formation of the ultra-thin silicon oxide film by the ozone water treatment, the thickness of the silicon oxide film depends much more upon the concentrations of ozone present in the ozone water than treatment time. It is also known that because of the effect of the diffusion controlled rate of the oxide, the formation of the silicon oxide film hardly proceeds beyond the thickness of 5 to 10 nm. Therefore, the ozone water treatment is featured by the capability of forming uniform ultra-thin silicon oxide films suffering less thickness variations in a case where the treatment is performed in a saturated sate to provide a stable thickness of the silicon oxide film.

For these reasons, the process for forming the ultra-thin silicon oxide film by the ozone water treatment has been used in the practical procedure as a preparatory step to the spin coating of the catalyst element solution. A procedure of forming a crystalline silicon film, including the ozone water treatment includes in this order: deposition of an amorphous silicon film; removal of a natural oxide film on the amorphous silicon film surface; ozone water treatment for forming a ultra-thin silicon oxide film over the amorphous silicon film; spin coating of a catalyst element solution; and heat treatment for thermal crystallization of the amorphous silicon film.

However, when the ozone water treatment for forming the ultra-thin silicon oxide film on the amorphous silicon film surface was applied to the actual semiconductor film forming procedure, the following serious problem occurred. In some of the substrates of a lot, a reddish eddy pattern was observed on the thermally crystallized crystalline silicon film. The reddish eddy pattern indicates a serious problem that the substrate surface formed with the crystalline silicon film contains a local amorphous region of lower crystallinity.

SUMMARY OF THE INVENTION

The present invention is directed to the solution to the above problem of the related art. More specifically, it is an object of the invention to solve the problem associated with the reddish eddy pattern considered to be the local amorphous region occurring on the thermally crystallized crystalline silicon film, and suffered by some of the substrates of a lot.

BRIEF DESCRIPTION OF THE DRAWINGS

FIGS. 3A and 3B show photographic data on a relation between the eddy pattern on the thermally crystallized crystalline silicon film and the ozone concentration of the ozone water.

FIGS. 4A to 4F are a group of sectional views of a substrate for illustrating steps of forming a crystalline silicon film by a vertical growth process.

FIGS. 6A and 6B are a group of sectional views for illustrating steps of fabricating an active-matrix liquid crystal display.

FIGS. 7A and 7B are a group of sectional views for illustrating steps of fabricating the active-matrix liquid crystal display.

FIGS. 8A and 8B are a group of sectional views for illustrating steps of fabricating the active-matrix liquid crystal display.

FIGS. 11A to 11F are a group of schematic diagrams showing examples of an electronic device incorporating the liquid crystal display.

DESCRIPTION OF THE PREFERRED EMBODIMENTS (Experiment for Improved Homogeneity in Ozone Water Treatment)

As a preparatory step to the spin coating of the catalyst element, the ozone water treatment was performed in the practical procedure thereby forming the ultra-thin silicon oxide film. As a result, the reddish eddy pattern was observed on the thermally crystallized crystalline silicon films of some of the substrates of a lot. The reddish eddy pattern indicates the serious problem of the presence of an amorphous state of low crystallinity in the substrate surface formed with the crystalline silicon film. This problem seemed to result from the following fact. The ozone water treatment for forming the ultra-thin silicon oxide film failed to provide a homogeneous surface state of the formed film so that the catalyst element solution was repelled locally. As a result, the catalyst element was not uniformly added. The inventors investigated the cause of the problem and contemplated a countermeasure thereagainst.

Figure 2:
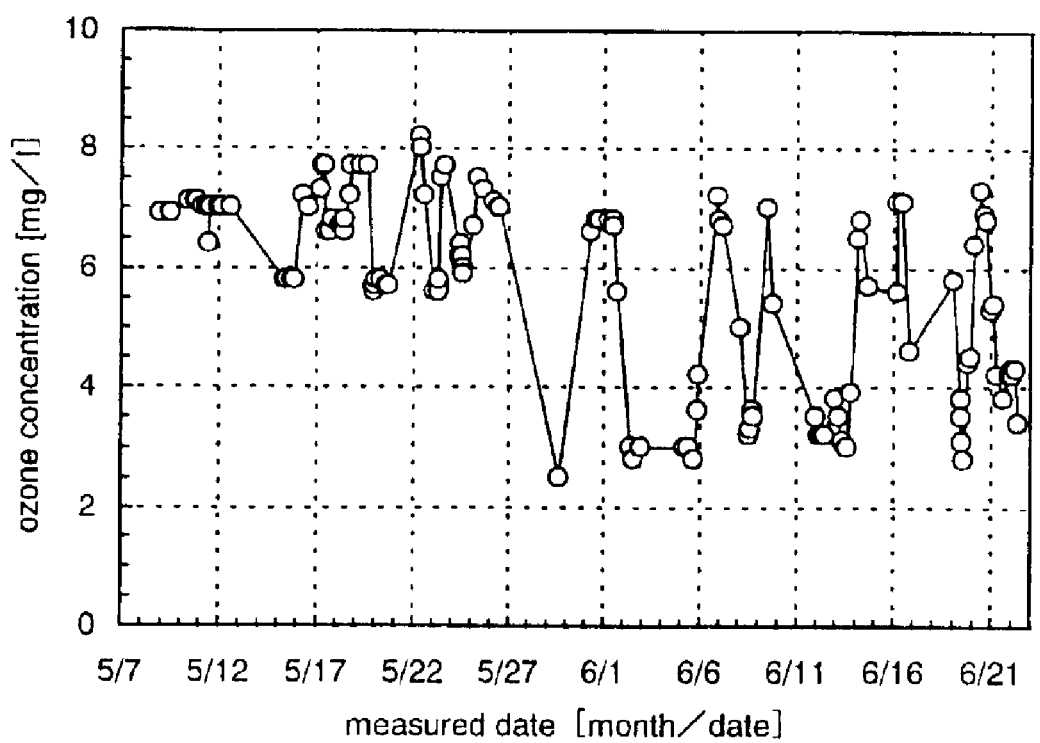
FIG. 2 shows data on time-varying ozone concentrations of the ozone water.

First, the inventors examined the concentrations of ozone in the ozone water at the occurrence of eddy pattern. As shown in FIG. 2, it was found that the concentrations of the ozone water violently varied with time in the range of 2 to 8 mg/l. The ozone water was prepared by dissolving ozone from an ozone generator in pure water. The time-varying efficiency of ozone generation by the ozone generator may be considered as a causative factor of the concentration variations with time. Besides, the influences of variations in pH value and concentrations of hydrogen peroxide water ($H_2O_2$) in the pure water containing dissolved ozone may also be the causative factors (see FIG. 2).

Since it was found, as mentioned above, that the violent variations of the ozone concentrations with time was associated with the occurrence of eddy pattern, the inventors decided to examine a cause-effect relation between the ozone concentration and the uniformity of the ultra-thin silicon oxide film. The inventors took a method of performing a test based on conditions listed in Table 1 varying the ozone concentrations, thereby to study the cause-effect relation between the ozone concentration and the uniformity of the ultra-thin silicon oxide film. The experiment was conducted as follows. An amorphous silicon film having a thickness of 50 nm was deposited on a glass substrate by plasma CVD, and then a natural oxide film over the amorphous silicon film was removed by dilute hydrofluoric acid. Subsequently, the resultant films were treated with ozone water varied in ozone concentrations (1.3 mg/l; 2 mg/l; 3 mg/l) for 60 seconds, respectively, thereby forming ultra-thin silicon oxide films not more than 5 nm in thickness on the amorphous silicon films surface. Then a catalyst element solution was spin coated on each of the substrates the solution comprising an aqueous solution of nickel acetate containing 10 ppm by weight of nickel. The resultant substrates were heat treated at 550° C. for 4 hours for thermal crystallization. Subsequently, the crystallized state of each substrate was visually inspected (see Table 1).

TABLE 1

| Item | Contents |
|---|---|
| Substrate | An amorphous silicon film having a thickness of 50 nm was deposited on a glass substrate by plasma CVD, and then a natural oxide film over the amorphous silicon film was removed by dilute hydrofluoric acid. |
| Ozone concentration conditions | 1.3 mg/l; 2 mg/l; 3 mg/l |
| Treatment time | 60 seconds |
| Catalyst element solution | Aqueous nickel acetate solution (10 ppm) |
| Thermal crystallization | at 550° C. for 4 hours |
| Inspection of crystallized state | The presence or absence of an eddy pattern was confirmed by visual inspection. |

The results of the experiment are shown in FIGS. 3A and 3B. FIG. 3A is a photographic representation of a substrate formed with a ultra-thin silicon oxide film using an ozone water containing 1.3 mg/l of ozone. A large eddy pattern is observed on the substrate. On the other hand, FIG. 3B is a photographic representation of a substrate formed with a ultra-thin silicon oxide film using an ozone water containing 2 mg/l of ozone. Although an eddy pattern is also observed, it is apparent that the eddy pattern is notably reduced in size. As to a ultra-thin silicon oxide film formed using an ozone water containing 3 mg/l of ozone, a photograph of the substrate thereof is not particularly taken. It was confirmed that the developed eddy pattern is even further reduced in size and some of the substrates are totally free from the eddy pattern. Thus, the results of the experiment demonstrates that the occurrence of eddy pattern greatly depends upon the ozone concentration during the ozone water treatment and is associated with low ozone concentrations (see FIGS. 3A and 3B).

The results shown in FIGS. 3A and 3B suggest that in the ozone water treatment at low ozone concentrations or specifically at the ozone concentrations of not more than 2 to 3 mg/l, the ultra-thin silicon oxide film is not formed in the saturated state providing the stable film thickness as indicated by formation deficiency of the ultra-thin silicon oxide film over the amorphous silicon film surface. Thus, a non-forming region for ultra-thin silicon oxide film may be produced at some part of the substrate, where the aqueous solution of nickel acetate as the catalyst element solution is repelled so that the catalyst element is not adequately introduced thus failing to achieve sufficient crystallization under the thermal crystallization conditions at temperature of 550° C. for duration of 4 hours. As a result, some of the substrates suffer a complex region of crystallization region and non-crystallization region, the complex region recognized as the eddy pattern (see FIGS. 3A and 3B).

In order to obviate the eddy pattern observed on some of the thermally crystallized substrates, the ozone concentrations of the ozone water may be stabilized in a high concentration range such that the ultra-thin silicon oxide film may be formed in a stable saturated state. However, it seems difficult to stabilize the ozone concentrations in the high concentration range because the causative factors of the concentration variations of the ozone water, as described above, include not only the variations in the efficiency of ozone generation by the ozone generator but also the variations of pH value and concentrations of hydrogen peroxide water ($H_2O_2$) in the pure water. Hence, the inventors also decided to study other countermeasures against the eddy pattern than the stabilization of ozone concentrations in high concentration range.

Characteristically, the eddy pattern is not encountered by all the substrates of a lot but by a part thereof. Suppose that the occurrence of eddy pattern depends solely upon the ozone concentrations of the ozone water, the eddy pattern will reasonably occur on all the substrates of a lot treated under low ozone concentration conditions. In fact, the eddy pattern does not occur at such frequencies. It is unlikely that the ozone concentration vary violently during the treatment of the substrates of the lot. Hence, it seems possible that other factors than the ozone concentration variations are involved in the occurrence of eddy pattern. A potential causative factor except for the ozone concentration variations is the influence of practical wait time between completion of the ozone water treatment and start of the subsequent spin coating of the catalyst element. The following reason may be given. Individual substrates of a lot have different wait times because the substrates are subjected to the ozone water treatment and the spin coating of the catalyst element based on the single wafer process system wherein the substrates processed in the reversed order of ozone water treatment and spin coating of the catalyst element. In this connection, the inventors decided to study a cause-effect relation between the occurrence of eddy pattern and the wait time between completion of ozone water treatment and the subsequent spin coating of catalyst element.

The inventors took a method of performing a test based on conditions listed in Table 2 varying the wait time between completion of the ozone water treatment and the subsequent spin coating of the catalyst element. The experiment was conducted as follows. There were prepared 10 glass substrates, on which an amorphous silicon film having a thickness of 50 nm was deposited by plasma CVD. A natural oxide film over the amorphous silicon film was removed with dilute hydrofluoric acid. Subsequently, based on the single wafer process system, the serially numbered glass substrates 1 to 10 were subjected to an ozone water treatment in ascending order, which was performed for 60 seconds using an ozone water containing 3.5 mg/l of ozone thereby to form a ultra-thin silicon oxide film on the amorphous silicon film. Then, based on the single wafer system, the glass substrates 10 to 1 were spin coated with a catalyst element solution in descending order, the solution comprised of an aqueous solution of to ppm nickel acetate. Thereafter, the glass substrates were heat treated at 550° C. for 4 hours for thermal crystallization. The crystallized state on each substrate was visually inspected. A similar experiment was conducted on a treatment using an ozone water containing 5 mg/l of ozone. It is noted that both the ozone water treatment and the spin coating of the catalyst element were performed based on the single wafer process system whereas the thermal crystallization process was performed on a batch basis (see Table 2).

TABLE 2

| Item | Contents |
|---|---|
| Substrate | An amorphous silicon film having a thickness of 50 nm was deposited on a glass substrate by plasma CVD, and then a natural oxide film over the amorphous silicon film was removed by dilute hydrofluoric acid. |
| Ozone concentration conditions | 3.5 mg/l; 5 mg/l |
| Ozone water treatment | Based on the single wafer process system, the serially numbered glass substrates 1 to 10 were subjected to an ozone water treatment in ascending order for 60 seconds. |
| Spin coating of catalyst element | Based on the single wafer process system, the glass substrates 10 to 1 were spin coated with a catalyst element solution comprising an aqueous nickel acetate solution (10 ppm) in descending order. |

TABLE 2-continued

| Item | Contents |
|---|---|
| Thermal crystallization | at 550° C. for 4 hours |
| Inspection of crystallized state | The presence or absence of an eddy pattern was confirmed by visual inspection. |

In the experiment of Table 2, the treatment with the ozone water containing 3.5 mg/l of ozone produced no eddy pattern on the substrates 1 to 7. However, the substrates 8 to 10 suffered the eddy pattern. In the treatment with the ozone water containing 5 mg/l of ozone, the substrates 1 to 9 were free from the eddy pattern and the substrate 10 alone sustained the eddy pattern. It was thus confirmed that the eddy pattern tends to occur on the substrate subjected to the spin coating immediately after the ozone water treatment or the substrate allowed to stand in air for a shorter period of wait time after the ozone water treatment. The treatment with the ozone water containing 3.5 mg/l of ozone produced the eddy pattern on the three substrates 8 to 10 whereas the treatment with the ozone water containing 5 mg/l of ozone produced the eddy pattern only on the substrate 10. This indicates that as the ozone concentration of the ozone water increases, the wait time under atmosphere can be correspondingly decreased.

The above experiment demonstrated that with increase in the ozone concentration of the ozone water, the wait time under atmosphere can be correspondingly decreased, thus suggesting the cause-effect relation between the ozone concentration and the wait time under atmosphere with respect to the occurrence of eddy pattern. Hence, a similar experiment to that of Table 2 was conducted on ozone concentrations of 2 mg/l; 3.5 mg/l; 5 mg/l; 7 mg/l. In this test, measurement was taken on wait time between completion of ozone water treatment and the subsequent spin coating of the catalyst element. The respective ozone concentrations (2 mg/l; 3.5 mg/l; 5 mg/l; 7 mg/l) were studied to determine wait time associated with the absence of eddy pattern.

Figure 1:
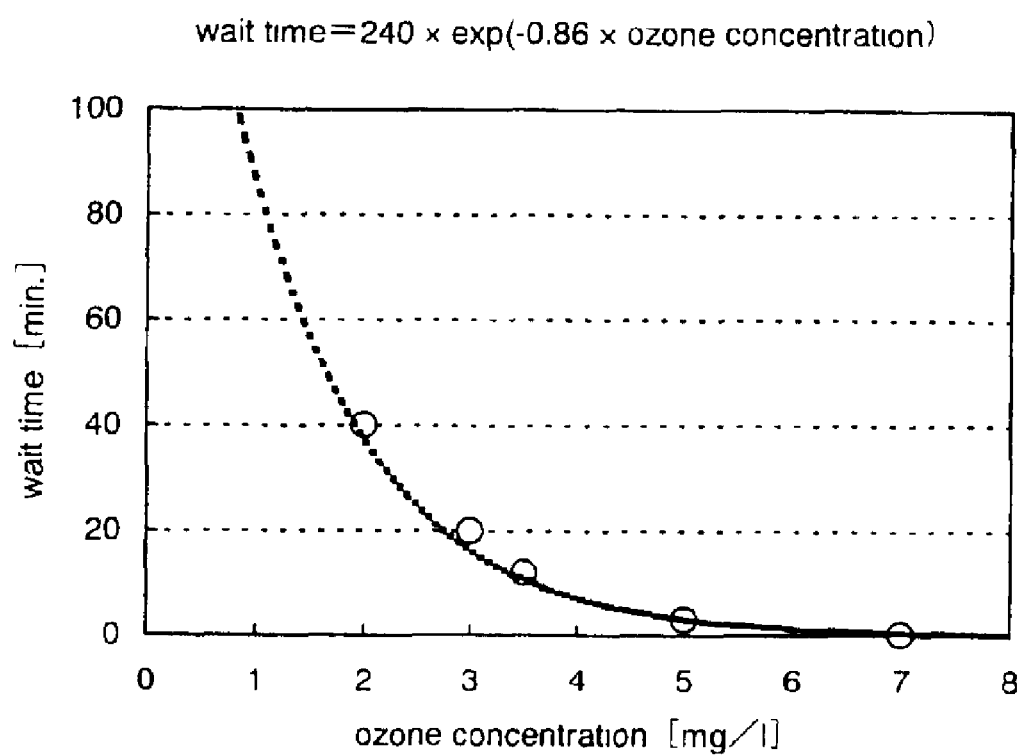
FIG. 1 shows graphical data on a relationship between ozone concentration of ozone water and wait time associated with absence of eddy pattern as a local amorphous region on a thermally crystallized crystalline silicon film.

Wait times associated with the absence of eddy pattern were plotted against the respective ozone concentrations (2 mg/l; 3.5 mg/l; 5 mg/l; 7 mg/l) thereby obtaining a curve of FIG. 1 representing a relation between the ozone concentration and the wait time associated with the absence of eddy pattern. Regression analysis showed that the curve can be represented by an empirical expression (1) for an exponential function (see FIG. 1).

$$A=240\times\exp(-0.86\times B) \quad (1)$$

wherein A denotes a wait time (min) associated with the absence of eddy pattern, and B denotes an ozone concentration (mg/l).

The curve of FIG. 1 indicates that with respect to a predetermined ozone concentration, the local amorphous region represented by the eddy pattern can be obviated by performing the spin coating of the catalyst element after the lapse of a wait time (time interval between completion of the ozone water treatment and start of the spin coating of the catalyst element) above this curve. It is noted here that the experiment for obtaining the above empirical expression (1) determined the presence of eddy pattern (local amorphous region) by visual inspection, evaluating the eddy pattern only from a macroscopic viewpoint. However, it is empirically known that the macroscopic evaluation based on visual inspection well serves the purpose of crystalline property evaluation at such a level to govern the semiconductor characteristics of thermally crystallized crystalline silicon films. Therefore, the experiment adopted the macroscopic evaluation based on visual inspection (see FIG. 1).

The relationship between the ozone concentration and the wait time associated with the absence of eddy pattern (local amorphous region), obtained from the above experiment as the empirical expression, can be effectively used for eliminating the local amorphous region occurring on some of the substrates of a lot. Specific examples of the usage of the relationship are as follows.

(Usage 1)

As a measure for ensuring the prevention of the local amorphous region, there may be contemplated a method including: previously determining an ozone concentration at the ozone water treatment by means of an ozone concentration meter; calculating an optimum wait time for the ozone concentration based on the empirical expression (1); and performing the spin coating of the catalyst element after the lapse of the wait time multiplied by a predetermined safety factor. It is noted that the empirical expression (1) is obtained from a single experiment, representing the relation between the ozone concentration and the wait time associated with the absence of local amorphous region. When the expression is applied to the actual production process, the variations of wait time need to be taken into consideration. Specifically, some production lines may include different ozone-water generating apparatus and spin coating system from those used in the experiment. Hence, it is expected that the constants (240, −0.86, etc.) of the empirical expression (1) may vary to some degree. Therefore, it is critical that when the empirical expression (1) is applied to the actual production process, such a wait time as determined by multiplying the optimum wait time given by the empirical expression (1) by a suitable safety factor (e.g., a factor of 1.2 to 2) is provided prior to the spin coating of the catalyst element.

(Usage 2)

The empirical expression (1) indicates that with increase in the ozone concentration, the optimum wait time can exponentially be decreased. In the light of productivity of the spin coating of the catalyst element, therefore, an optimum wait time in terms of productivity may previously be determined and the optimum wait time so determined may be applied to the empirical expression (1) for reverse calculation of an ozone concentration corresponding to the optimum wait time. Control of the ozone concentration above the level determined by the reverse calculation serves both the purposes of obviating the local amorphous region and ensuring the productivity of the spin coating of the catalyst element. In this case, as well, it is more desirable to control the ozone concentration above a level given by multiplying the reversely calculated ozone concentration by a suitable safety factor (e.g., a factor of 1.2 to 2) for positively obviating the local amorphous region.

In order to ensure that all the substrates of a lot are free from the local amorphous region, it is more desirable to provide every substrate of the lot with an equal wait time between the ozone water treatment and the spin coating of the catalyst element. In an approach to provide every substrate of the lot with the equal wait time, the processes must be performed based on such a single wafer process system that the individual substrates of the lot are subjected to the ozone water treatment and the spin coating of the catalyst element in the same order. The catalyst element adding process is not particularly limited to the spin coating. The catalyst element may be added by any other process that ensures uniform application of the catalyst element onto the substrate surface. Other usable catalyst element adding processes now under review include roller coating, spray coating, shower coating and the like.

The above usages have been described by way of the procedures. It is important in terms of good productivity and labor savings to implement an integrated system by incorporating the procedure in the fabrication system which is provided with means for controlling the procedure including judgment. A semi-automated fabrication system allowing an operator to make judgment and based on the judgment, allowing the system to program conditions is also important from a viewpoint of obviating the deficiencies of crystalline characteristics. Accordingly, the fabrication system requires the provision of sensing means, control/judgment means and condition programming means for performing these tasks.

(Description of Catalyst Element Solution)

Although the catalyst element solution for use in the catalyst element adding process has already been disclosed in Japanese Patent Laid-Open No. 211636/1995, the catalyst element solution is limited to aqueous solution according to the object of the invention. Hence, the catalyst element solution will be described herein on condition that a solvent is limited to an aqueous solution.

The solvent for use in the catalyst element solution may be an aqueous solution or an organic solvent. In the case of the organic solvent which is rich in carbon, a fear exists that carbon atoms as impurities may be captured in the crystalline semiconductor film during the thermal crystallization process subsequent to the catalyst element adding process. In this respect, the organic solvent is unfavorable as the solvent but the aqueous solution is preferred. Where the solvent is an aqueous solution and Ni(nickel) is used as the catalyst element, a nickel compound is generally employed. Examples of a typical nickel compound include nickel bromide, nickel acetate, nickel oxalate, nickel carbonate, nickel chloride, nickel iodide, nickel nitrate, nickel sulfate, nickel formate, nickel acetyl acetate, 2-ethyl hexane nickel, 4-cyclohexyl nickel butyrate, nickel oxide, and nickel hydroxide. Where instead of the nickel compound, elemental nickel is dissolved in the aqueous solution, the nickel element may preferably be dissolved in an aqueous solution of inorganic acid.

Other usable catalyst elements than nickel include metals such as Fe, Co, Ru, Rh, Pd, Os, Ir, Pt, Cu, and Au. Although it is a general practice to dissolve a catalyst element alone in the aqueous solution, plural types of catalyst elements may also be used in combination. Similarly to nickel, these catalyst elements in the form of compound may be dissolved in the aqueous solution, or otherwise the elemental catalysts may be dissolved in the aqueous solution of inorganic acid.

Examples of a typical compound of each of the above catalyst elements are as follows.

(Fe element): Ferrous bromide, ferric bromide, ferric acetate, ferrous chloride, ferric fluoride, ferric nitrate, ferrous phosphate, ferric phosphate, etc.

(Co element): Cobalt bromide, cobalt acetate, cobalt chloride, cobalt fluoride, cobalt nitrate, etc.

(Ru element): Ruthenium chloride, etc.

(Rh element): Rhodium chloride, etc.

(Pd element): Palladium chloride, etc.

(Os element): Osmium chloride, etc.

(Ir element): Iridium trichloride, iridium tetrachloride, etc.

(Pt element): Platinic chloride, etc.

(Cu element): Cupric acetate, cupric chloride, cupric nitrate, etc.

(Au element): Gold trichloride, gold chloride salt, tetrachlorogold sodium, etc.

(Method for Forming Crystalline Semiconductor Film)

The relationship between the ozone concentration of ozone water and the wait time associated with the absence of eddy pattern as the local amorphous region, which is obtained from the above experiment, can be effectively used as the countermeasure against the local amorphous region in the process for forming a silicon-containing crystalline semiconductor film. Description will be made herein as to a method for forming the silicon-containing crystalline semiconductor film where the relationship is used as the countermeasure against the local amorphous region. The method for forming the silicon-containing crystalline semiconductor film includes a so-called vertical growth process and lateral growth process, both of which will be described. The vertical growth process means a crystal growth process which includes uniformly adding a catalyst element to the overall surface of a silicon-containing amorphous semiconductor film and then thermally crystallizing the film. The process is characterized by crystal growth proceeding vertically (perpendicular to the substrate surface) from the amorphous semiconductor film surface applied with the catalyst element and hence, is referred to as "vertical growth process" herein. On the other hand, the lateral growth process is a crystal growth process including adding a catalyst element to a part of the silicon-containing amorphous semiconductor film via an opening of a mask insulating film and then thermally crystallizing the semiconductor film. The process is characterized by crystal growth proceeding laterally (parallel with the substrate surface) due to thermal diffusion of the element from the opening to a peripheral area and hence, is referred to as "lateral growth process" herein.

(1) Vertical Growth Process

A method for forming a silicon-containing crystalline semiconductor film according to a vertical growth process of the invention comprises: a first step of depositing a silicon-containing amorphous semiconductor film on an insulative substrate such as glass substrate; a second step of performing ozone water treatment for forming a ultra-thin oxide film on a surface of the amorphous semiconductor film; a third step of adding a catalyst element for accelerating crystallization to the overall surface of the amorphous semiconductor film formed with the ultra-thin oxide film thereon; and a fourth step of heat treating the amorphous semiconductor film thereby forming a silicon-containing crystalline semiconductor film.

As to this process for forming the silicon-containing crystalline semiconductor film, the inventors found the following countermeasures to be taken in the fourth step so as to obviate the local amorphous region suffered by some of the substrates of a lot.

(Countermeasure 1)

An ozone concentration of the ozone water used in the second step is determined. The concentration thus determined is substituted in the relationship, Wait time=240×exp(−0.86×ozone concentration), between the ozone concentration and the wait time for obviating the local amorphous region occurring on some of the substrates of a lot in the fourth step, thereby finding an optimum wait time for the ozone concentration. That is, the countermeasure 1 is characterized by a time interval between the second and third steps, which is at least as long as the optimum wait time. More preferably, the countermeasure is characterized by such a wait time as determined by multiplying the optimum wait time by a predetermined safety factor and provided between the second and third steps. It is noted that the wait time is shown in minutes and the unit of measurement of ozone concentration is mg/l.

(Countermeasure 2)

A given wait time between the second and third steps is defined from a viewpoint of productivity. An optimum ozone concentration for the given wait time is determined by the reverse calculation based on the relationship, Wait time=240×exp(−0.86×ozone concentration), between the ozone concentration of the ozone water used in the second step and the wait time for obviating the local amorphous region remaining on some of the substrates of a lot in the fourth step. That is, the countermeasure 2 is characterized by an ozone concentration used in the second step, which is at least as great as the optimum ozone concentration of the ozone water. More preferably, the countermeasure is characterized by such an ozone concentration of the ozone water as determined by multiplying the optimum ozone concentration by a predetermined safety factor and used in the second step. It is noted that the wait time is shown in minutes and the unit of measurement of ozone concentration is mg/l.

(2) Lateral Growth Process

A method for forming a silicon-containing crystalline semiconductor film according to a lateral process of the invention comprises: a first step of depositing a silicon-containing amorphous semiconductor film on an insulative substrate such as glass substrate; a second step of depositing a mask insulating film over the amorphous semiconductor film and forming an open region at a part of the mask insulating film; a third step of performing ozone water treatment for forming a ultra-thin oxide film on the open region of the mask insulating film; a fourth step of adding a catalyst element for accelerating crystallization to the open region of the mask insulating film; and a fifth step of heat treating the amorphous semiconductor film thereby forming a silicon-containing crystalline semiconductor film.

As to this process for forming the silicon-containing crystalline semiconductor film, the inventors found the following countermeasures to be taken in the fifth step so as to eliminate the local amorphous region suffered by some of the substrates of a lot.

(Countermeasure 1)

An ozone concentration of the ozone water used in the third step is determined. The concentration thus determined is substituted in the relationship, Wait time=240×exp(−0.86×ozone concentration), between the ozone concentration and the wait time for obviating the local amorphous region remaining on some of the substrates of a lot in the fifth step, thereby determining an optimum wait time for the ozone concentration. That is, the countermeasure 1 is characterized by a time interval provided between the third and fourth steps, which is at least as long as the optimum wait time. More preferably, the countermeasure is characterized by such a wait time as determined by multiplying the optimum wait time by a predetermined safety factor and provided between the third and fourth steps. It is noted that the wait time is shown in minutes and the unit of measurement of ozone concentration is mg/l.

(Countermeasure 2)

A given wait time between the third and fourth steps is defined. An optimum ozone concentration for the given wait time is determined by the reverse calculation based on the relationship, Wait time=240×exp(−0.86×ozone concentration), between the ozone concentration of the ozone water used in the third step and the wait time for obviating the local amorphous region remaining on some of the substrates of a lot in the fifth step. That is, the countermeasure 2 is characterized by an ozone concentration used in the third step, which is at least as great as the optimum ozone concentration of the ozone water. More preferably, the countermeasure is characterized by such an ozone concentration of the ozone water as determined by multiplying the optimum ozone concentration by a predetermined safety factor and used in the third step. It is noted that the wait time is shown in minutes and the unit of measurement of ozone concentration is mg/l.

As mentioned supra, the method for forming the silicon-containing crystalline semiconductor film based on the vertical growth or lateral growth process can obviate the local amorphous region by using the relationship between the ozone concentration and the wait time associated with the absence of local amorphous region or the relationship between the ozone concentration and the wait time for obviating the local amorphous region remaining after thermal crystallization. In this method, the ozone water treatment step and the catalyst element adding step may adopt the single wafer process system wherein the substrates of a lot are subjected to the processes in the same order, thereby providing every substrate with a substantially equal wait time between the ozone water treatment step and the catalyst element adding step. It is thus ensured that all the substrates of a lot are free from the local amorphous region. A typical process for adding the catalyst element includes, but not limited to, spin coating. The catalyst element may be added by any of the other adding processes such as roller coating, spray coating and shower coating.

It is noted that the relationship, Wait time=240×exp(−0.86×ozone concentration), between the ozone concentration of the ozone water and the wait time for obviating the local amorphous region occurring on the thermally crystallized silicon-containing crystalline semiconductor film has been deduced from the process for forming the silicon-containing crystalline semiconductor film based on the vertical growth process. In the process for forming the silicon-containing crystalline semiconductor film based on the lateral growth process, as well, the repellency of the aqueous solution of nickel acetate as the catalyst element solution is also observed at the open region of the mask insulating film if the ozone water treatment is insufficient. This suggests that the local amorphous region causing the repellency also occurs. Therefore, the countermeasures against the local amorphous region based on the relationship have been mentioned regarding the method for forming the silicon-containing crystalline semiconductor film based on the lateral growth process, as well.

Incidentally, the aforesaid ultra-thin silicon oxide film is formed for increasing wettability between the silicon film and the aqueous solution for Ni addition. If the silicon oxide film is not required by the subsequent steps, the film is readily etched away using an aqueous solution of dilute hydrofluoric acid. On the other hand, the treatment with dilute hydrofluoric acid solution may be dispensed with to leave the oxide film as it is, if the oxide film does not adversely affect the required characteristics of a device to be fabricated.

According to the present specification, a special term "silicon-containing amorphous semiconductor film" is used instead of a normal term "amorphous silicon film". The definition of the term is clarified here. The silicon-containing amorphous semiconductor film means an amorphous film containing silicon which exhibits semiconductor characteristics through crystallization. Naturally, the definition includes an amorphous silicon film as well as all the amorphous semiconductor films containing silicon. For instance, an amorphous film comprising a compound of silicon and germanium, which is expressed as $Si_{1-x}Ge_x$ (0<x<1, typically 0.001 to 0.05), is also included. On the other hand, a technical term "silicon-containing crystalline semiconductor film" is used to mean a film obtained by crystallizing the silicon-containing amorphous semiconductor film. The reason for expressing "crystalline" instead of "polycrystal" is that in contrast to the normal polycrystal semiconductor films, the inventive semiconductor film features crystal grains substantially oriented in the same direction, having specific characteristics such as high field mobility.

[Embodiment Mode 1]

According to an embodiment mode of the method for forming the crystalline silicon film based on the vertical growth process, a specific description is made on a method of approach to obviate the occurrence of eddy pattern representative of a local amorphous region remaining on a thermally crystallized substrate by using the relationship between the ozone concentration of the ozone water and the wait time associated with the absence of local amorphous region on a crystalline silicon film. FIGS. 4A to 4F are sectional views of a substrate for illustrating steps of forming the crystalline silicon film by the vertical growth process.

Firstly, an amorphous silicon film 102 having a thickness of 10 to 150 nm is deposited on a glass substrate 101 by vacuum CVD or plasma CVD. This embodiment uses the plasma CVD process for depositing the amorphous silicon film 102 in thickness of 100 nm. During the deposition, a ultra-thin natural oxide film 103 is formed on a surface of the amorphous silicon film 102 due to the effect of oxygen entered from the ambient air into a process atmosphere (see FIG. 4A).

Subsequently, the substrate is subjected to cleaning with dilute hydrofluoric acid for a predetermined period of time based on the single wafer process system. The cleaning step removes the natural oxide film 103 over the amorphous silicon film 102, followed by an overflow rinse with water and then by drying (see FIG. 4B).

Subsequently, the surface of the amorphous silicon film 102 is treated with ozone water for a predetermined period of time, thereby forming thereover a clear ultra-thin silicon oxide film 104 in thickness of not more than 5 nm. In this embodiment, the ozone water treatment is performed based on the single wafer process system for 60 seconds, thereby forming the ultra-thin silicon oxide film 104 having a thickness of not more than 5 nm. It is noted that the ultra-thin silicon oxide film 104 is formed such that an aqueous solution of nickel acetate as the catalyst element solution to be added in the subsequent step may be increased in wettability with the amorphous silicon film 102. The increased wettability contributes to the suppression of a phenomenon of repelling the aqueous solution of nickel acetate. As a result, nickel element may uniformly be added (see FIG. 4C).

Next, the aqueous solution of nickel acetate as the catalyst element solution for accelerating crystallization is applied to the overall surface of the amorphous silicon film 102 (strictly, the ultra-thin silicon oxide film 104) by spin coating. In this case, nickel acetate as a Ni compound is dissolved in pure water and the concentration of the nickel acetate in the resultant aqueous solution is adjusted to 10 ppm by weight. Then a puddle 105 of the aqueous solution is formed on the substrate by spin coating based on the single wafer process system. The spin coating step is performed based on the single wafer process system wherein the substrates are processed in the same order as in the previous step of ozone water treatment (see FIG. 4D).

Next, the substrate is subjected to a 30-second spin drying at a predetermined spinning speed, thereby allowing a Ni-containing layer 106 to be uniformly adhered to the overall surface of the amorphous silicon film 102 (strictly, the ultra-thin silicon oxide film 104) (see FIG. 4E).

Although the above description cites the individual apparatus for individual step, it is also possible to implement a single processing system by integrating all these apparatuses.

Next, a special heat treatment furnace is operated for the amorphous silicon film 102 is subjected to the heat treatment in a nitrogen atmosphere. The heat treatment at temperatures in the range of 450 to 750° C. accomplishes crystallization by virtue of the effect of the catalyst element for accelerating crystallization. In general, the heat treatment at lower temperatures requires the extension of process time, resulting in decreased productivity. On the other hand, the heat treatment at temperatures of above 600° C. reveals a problem associated with heat resistance of the glass substrate used as a substrate. Where the glass substrate is used, therefore, it is reasonable to perform the heat treatment at temperatures in the range of 450 to 600° C. In an actual heat treatment process, suitable heat treatment conditions vary depending upon processes for depositing the amorphous silicon film 102. In the case of deposition by vacuum CVD process, for example, heat treatment at 600° C. need be performed for 12 hours or so. In the case of deposition by plasma CVD process, a 4-hour heat treatment at 550° C. is sufficient for accomplishing the crystallization. In this embodiment, since the 100-nm thick amorphous silicon film 102 was deposited by plasma CVD process, the heat treatment at 550° C. was performed for 4 hours, thereby forming a crystalline silicon film 107. Incidentally, the heat treatment adopts the batch process system where the treatment is performed on a lot-by-lot basis (see FIG. 4F).

In such a method for forming the crystalline silicon film based on the vertical growth process, there have been contemplated the following countermeasures against the occurrence of eddy pattern (local amorphous region) on the thermally crystallized crystalline silicon film 107. Each of the countermeasure will be described in detail.

(Countermeasure 1)

In the ozone water treatment for forming the ultra-thin silicon oxide film 104 in thickness of not more than 5 nm on the surface of the amorphous silicon film 102, the ozone concentration is determined by means of an ozone concentration meter attached to an apparatus for preparing ozone water. Then, a wait time corresponding to the ozone concentration thus determined is calculated using the relationship, Wait time=$240 \times \exp(-0.86 \times \text{ozone concentration})$, between the ozone concentration of the ozone water and the wait time associated with the absence of eddy pattern as the local amorphous region on the thermally crystallized crystalline silicon film 107. The calculated wait time defines a wait time provided between the ozone water treatment and the spin coating of the catalyst element. Prior to the spin coating of the catalyst element, there may be allowed for such a wait time as determined by multiplying the calculated wait time by a predetermined safety factor (e.g., a factor of 1.2 to 2) whereby the occurrence of the eddy pattern as the local amorphous region on the thermally crystallized crystalline silicon film 107 can be avoided. Since both the ozone water treatment and the spin coating of the catalyst element are performed based on the single wafer process system wherein the substrates are processed in the same order, every substrate of a lot substantially has the same wait time. This ensures that all the substrates of a lot are free from the eddy pattern representative of the local amorphous region.

(Countermeasure 2)

The relationship, Wait time=$240 \times \exp(-0.86 \times \text{ozone concentration})$, between the ozone concentration of the ozone water and the wait time associated with the absence of the eddy pattern as the local amorphous region on the thermally crystallized crystalline silicon film 107, which relationship is used in the above countermeasure 1, indicates that with increase in the ozone concentration of the ozone water, the optimum wait time can exponentially be decreased. The shorter wait time is the more preferred from the viewpoint of productivity. Hence, an optimum wait time between the ozone water treatment and the spin coating of the catalyst element is first determined. The optimum wait time can be substituted in the relationship for reverse calculation of an ozone concentration corresponding to the optimum wait time. Control of the ozone concentration at levels not smaller than the ozone concentration thus found serves the dual purposes of obviating the eddy pattern as the local amorphous region and ensuring the productivity of the spin coating of the catalyst element. In this case, as well, it is more preferred to control the ozone concentration at levels not smaller than an ozone concentration obtained by multiplying the ozone concentration determined by the reverse calculation by a predetermined safety factor (e.g., a factor of 1.2 to 2) in the light of positive implementation of the countermeasure against the local amorphous region.

As described above, the method for forming the crystalline silicon film based on the vertical growth process takes advantage of the above two countermeasures for positively obviating the problem of the eddy pattern (local amorphous region) occurring on the thermally crystallized crystalline silicon film 107.

The countermeasures may be implemented as follows for assuredly reducing the frequency of occurrence of deficiencies. That is, the fabrication system may be provided with means for inputting the relationship and information including ozone concentration and wait time, such that the system can automatically perform judgment and calculation of the wait time and then, the steps based on the wait time thus determined.

Alternatively, in a case where a potential deficiency is expected from calculation by substituting the present ozone concentration in the aforesaid relationship with a preprogrammed wait time, means incorporated in the fabrication system for giving instruction to increase the ozone concentration or to extend the wait time based on the relationship provides automatic prevention of the deficiency according to the judgment made by the system itself but not the operator.

[Embodiment Mode 2]

According to an embodiment mode of the method for forming the crystalline silicon film based on the lateral growth process, a specific description is made on a method of approach to obviate a local amorphous region thought to appear on the thermally crystallized substrate by way of the relationship between the ozone concentration of the ozone water and the wait time associated with the absence of local amorphous region on the crystalline silicon film. FIGS. 5A to 5E are sectional views of a substrate for illustrating steps of forming the crystalline silicon film by the lateral growth process.

Firstly, an amorphous silicon film 202 is deposited on a glass substrate 201 in thickness of 10 to 150 nm by vacuum CVD process or plasma CVD process. This embodiment uses plasma CVD process for depositing the amorphous silicon film 202 in thickness of 100 nm. During the deposition, a ultra-thin natural oxide film (not shown) is formed on an surface of the amorphous silicon film 202 due to the effect of oxygen entered from the ambient air into a process atmosphere (see FIG. 5A).

Figure 5A:
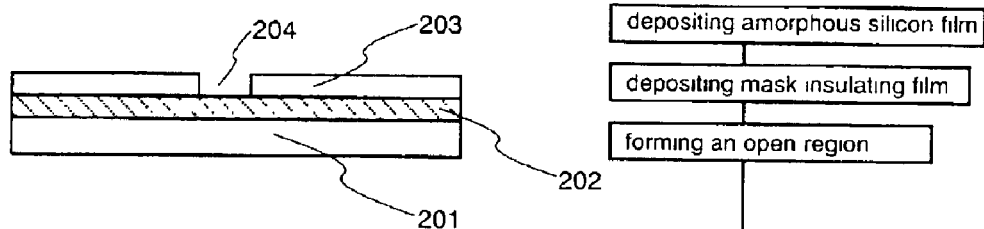
FIGS. 5A to 5E are a group of sectional views of a substrate for illustrating steps of forming a crystalline silicon film by a lateral growth process.
Figure 5B:
Figure 5C:
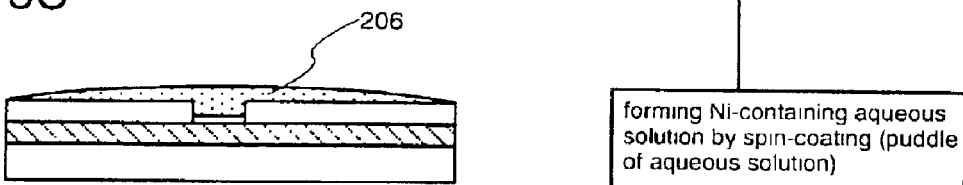
Figure 5D:
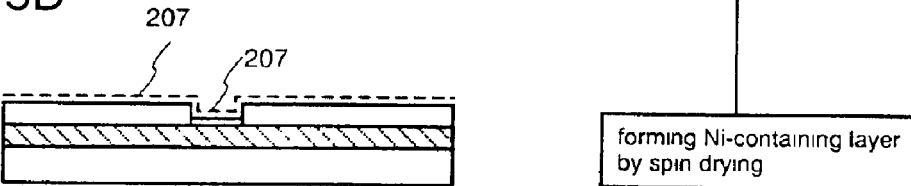
Figure 5E:
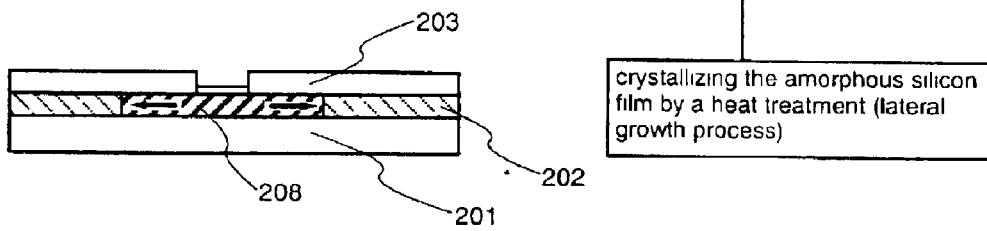
Figure 9A:
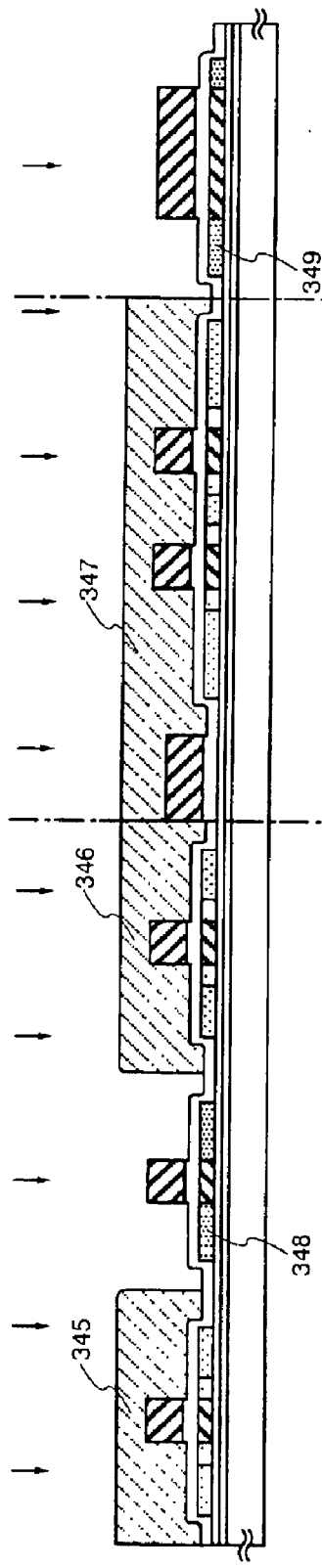
FIGS. 9A and 9B are a group of sectional views for illustrating steps of fabricating the active-matrix liquid crystal display.
Figure 9B:
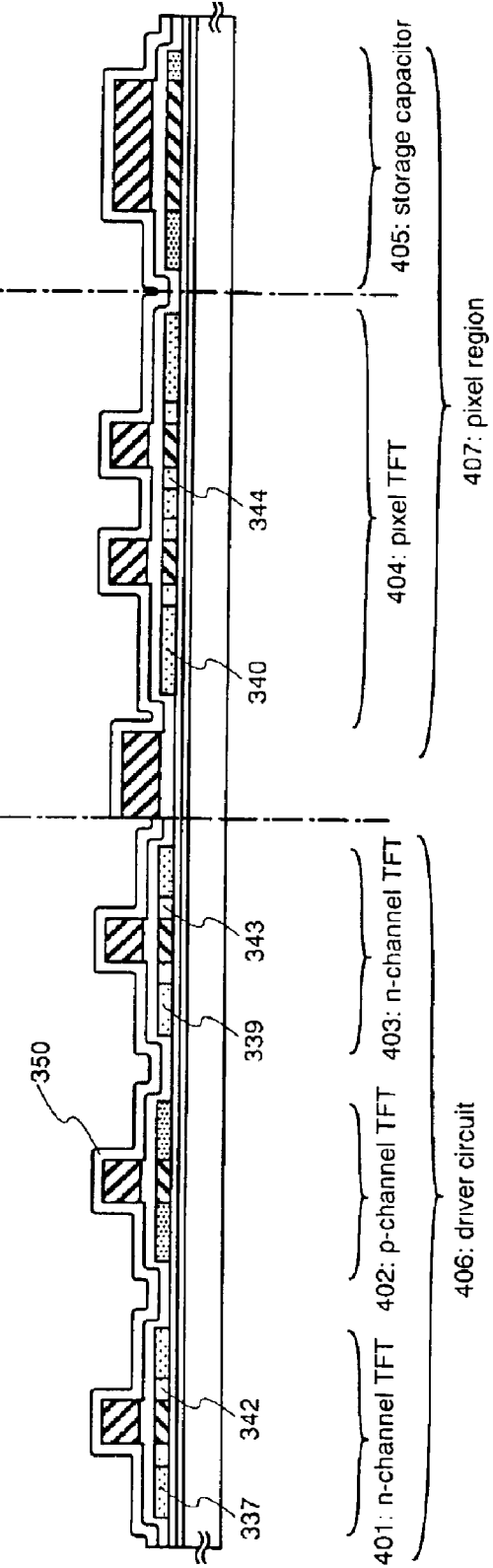
Figures 10A, 10B:
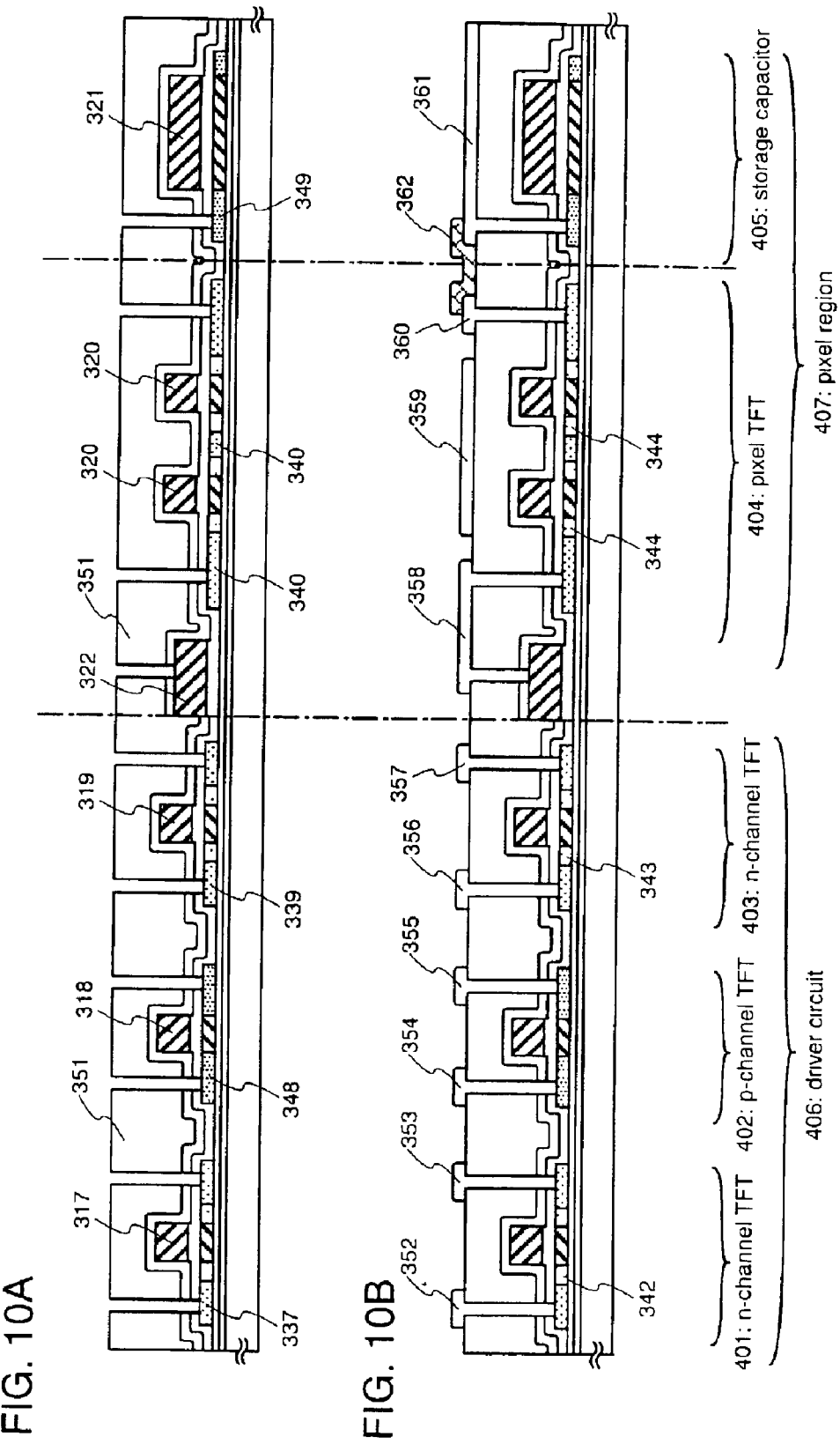
FIGS. 10A and 10B are a group of sectional views for illustrating steps of fabricating the active-matrix liquid crystal display.

Next, a plasma CVD process is performed for depositing a mask insulating film 203 comprised of a silicon oxide film having a thickness of 70 to 200 nm. In this embodiment, the mask insulating film 203 having a thickness of 120 nm is deposited by plasma CVD process. Then, known photolithographic and etching processes (wet etching with a hydrofluoric-acid etchant is commonly used) are performed for forming an open region 204 on a part of the mask insulating film 203. The open region 204 is a portion into which a catalyst element (nickel element is also employed by this embodiment) is selectively introduced. Since the wet etching with the hydrofluoric-acid etchant also removes the natural oxide film (not shown) over the amorphous silicon film 202, the amorphous silicon film 202 is exposed from a bottom of the open region 204. Although FIG. 5A shows only one open region 204 as a typical representation, a plurality of open regions 204 are actually formed at space intervals of several hundred micrometers (see FIG. 5A).

Subsequently, the substrate is subjected to the ozone water treatment for a predetermined period of time thereby forming a clear ultra-thin silicon oxide film 205 having a thickness of not more than 5 nm on the area of the open region 204 where the amorphous silicon film 202 is exposed. In this embodiment, a 60-second ozone water treatment is performed based on the single wafer process system thereby forming the ultra-thin silicon oxide film 205 in thickness of not more than 5 nm. It is noted that formation of the ultra-thin silicon oxide film 205 on the amorphous silicon film 202 in the open region 204 increases the wettability with the amorphous silicon film 202 in the open region 204 when adding an aqueous solution of nickel acetate as the catalyst element solution in the subsequent step. The increased wettability contributes to the suppression of a repelling phenomenon of the aqueous solution of nickel acetate in the open region 204. As a result, nickel element may uniformly be added (see FIG. 5B).

Next, the aqueous solution of nickel acetate as the catalyst element solution is spin coated on the substrate for selectively introducing nickel element into a part of the amorphous silicon film 202 through the open region 204 the nickel element serving to accelerate the crystallization. In this case, the aqueous solution of nickel acetate is prepared by dissolving nickel acetate as a Ni compound in pure water, and adjusting the concentration of the nickel compound to 10 ppm by weight. A puddle 206 of the aqueous solution is formed on the substrate by spin coating based on the single wafer process system. The spin coating step adopts the single wafer process system wherein the substrates are processed in the same order as in the previous ozone water treatment (see FIG. 5C).

Next, the substrate is subjected to a 30-second spin-drying at a predetermined spinning speed, thereby allowing a Ni-containing layer 207 to be uniformly adhered to the overall surface of the substrate. In this process, the Ni-containing layer 207 adhered to the surface of the amorphous silicon film 202 (strictly, the ultra-thin silicon oxide film 205) in the open region 204 actually contributes to the crystallization of the amorphous silicon film 202 (see FIG. 5D).

Next, the special heat treatment furnace is operated for the heat treatment of the substrate in the nitrogen atmosphere. The heat treatment at temperatures in the range of 450 to 750° C. accomplishes crystallization of amorphous silicon film 202 by virtue of the effect of the catalyst element, the catalyst element serving to accelerate the crystallization. In general, the heat treatment at lower temperatures requires the extension of process time, resulting in decreased productivity. The heat treatment at temperatures of above 600° C. reveals a problem associated with heat resistance of the glass substrate used as a substrate. Where the glass substrate is used, therefore, it is reasonable to perform the heat treatment at temperatures in the range of 450 to 600° C. In this embodiment, heat treatment at 570° C. is performed for 14 hours in the nitrogen atmosphere thereby crystallizing the amorphous silicon film 202 to form a crystalline silicon film 208. In this process, nickel element is selectively introduced via the open region 204. Hence, nickel element is diffused from the open region 204 toward peripheral areas while the crystallization of the amorphous silicon film 202 characteristically proceeds laterally (parallel with the substrate surface). Incidentally, the heat treatment adopts a batch process system wherein the substrates are processed on a lot-by-lot basis (see FIG. 5E).

In the lateral growth process for crystalline silicon film formation including these steps, there are contemplated the following countermeasures against the local amorphous region feared to appear on the thermally crystallized crystalline silicon film 208. Each of the countermeasures will be described in detail.

(Countermeasure 1)

In the ozone water treatment for forming the ultra-thin silicon oxide film 205 in thickness of not more than 5 nm over the amorphous silicon film 202 exposed from the bottom of the open region 204 in the mask insulating film 203, the ozone concentration is measured by means of the ozone concentration meter attached to the apparatus for preparing ozone water. Then, a wait time corresponding to the ozone concentration thus determined is calculated using the relationship, Wait time=240×exp(−0.86×ozone concentration), between the ozone concentration of the ozone water and the wait time associated with the absence of local amorphous region on the thermally crystallized crystalline silicon film 208. The calculated wait time defines a wait time provided between the ozone water treatment and the spin coating of the catalyst element. Prior to the spin coating of the catalyst element, there may be allowed for such a wait time as determined by multiplying the calculated wait time by a predetermined safety factor (e.g., a factor of 1.2 to 2) whereby the occurrence of the local amorphous region on the thermally crystallized crystalline silicon film 208 can be avoided. Since both the ozone water treatment and the spin coating of the catalyst element are performed based on the single wafer process system wherein the substrates are processed in the same order, every substrate of a lot substantially has the same wait time. This ensures that all the substrates of a lot are free from the local amorphous region.

(Countermeasure 2)

The relationship used in the above countermeasure 1, Wait time=240×exp(−0.86×ozone concentration), between the ozone concentration of the ozone water and the wait time associated with the absence of local amorphous region on the thermally crystallized crystalline silicon film 208, indicates that with increase in the ozone concentration of the ozone water, the optimum wait time can exponentially be decreased. The shorter wait time is the more preferred from the viewpoint of productivity. Hence, an optimum wait time between the ozone water treatment and the spin coating of the catalyst element is first determined. The optimum wait time can be substituted in the relationship set forth above, so that an ozone concentration corresponding to the optimum wait time can be reversely calculated. Control of the ozone concentration at levels not smaller than the ozone concentration thus found serves the dual purposes of obviating the local amorphous region and ensuring the productivity of the catalyst element in the spin coating process. In this case, as well, it is more preferred to control the ozone concentration at levels not smaller than an ozone concentration obtained by multiplying the ozone concentration determined by the reverse calculation by a proper safety factor (e.g., a factor of 1.2 to 2) in the light of positive implementation of the countermeasure against the local amorphous region.

As described above, the method for forming the crystalline silicon film based on the lateral growth process takes advantage of the above two countermeasures for positively obviating the problem of the local amorphous region thought to appear on the thermally crystallized crystalline silicon film 208.

EMBODIMENT

[Embodiment 1]

Now referring to FIGS. 6A to 10B, description is made on a specific example of a method of approach to eliminate the eddy pattern as the local amorphous region occurring on the thermally crystallized substrate, the method adopted by a fabrication process of a liquid crystal display having a crystalline silicon film formed by the vertical growth process using a catalyst element. Incidentally, FIGS. 6A to 10B are sectional views showing steps of fabricating an active-matrix liquid crystal display.

First, a silicon oxynitride film 302a as a first layer and a silicon oxynitride film 302b as a second layer are deposited on a glass substrate 301 by plasma CVD process in respective thicknesses of 50 nm and 100 nm, the films having different percentage compositions. Thus is formed a base film 302. Examples of a usable glass substrate 301 include quartz glass, barium boro-silicate glass, or alumino boro-silicate glass and the like. Next, an amorphous silicon film 303a having a thickness of 55 nm is deposited on the base film 302 (302a and 302b) by plasma CVD process. During the deposition, an ultra-thin natural oxide film (not shown) is formed on a surface of the amorphous silicon film 303a due to oxygen entered from the air into a process atmosphere. This example uses plasma CVD process for deposition of the amorphous silicon film 303a, but low pressure CVD process can be used to deposit alternatively. (see FIG. 6A).

The deposition of the amorphous silicon film 303a involves a possibility of entrance of carbon, oxygen and nitrogen present in the air. It is empirically known that the entrance of such impurity gasses will deteriorate TFT characteristics finally obtained. Thus, the above entrance of impurity gasses are known to act as an inhibition factor of crystallization. Hence, it is desirable to thoroughly exclude the entrance of the impurity gasses. Specifically, carbon or nitrogen may preferably be present in concentrations of not more than $5 \times 10^{17}$ atoms/cm$^3$, whereas oxygen may preferably be present in concentrations of not more than $1 \times 10^{18}$ atoms/cm$^3$ (see FIG. 6A).

Next, the substrate is subjected to cleaning with dilute hydrofluoric acid for a predetermined period of time. The cleaning removes the natural oxide film (not shown) over the amorphous silicon film 303a, followed by an overflow rinse with water and then, the substrate is dried. Subsequently, the ozone water treatment is performed for forming a ultra-thin silicon oxide film (not shown) in thickness of not more than 5 nm over the amorphous silicon film 303a. The ozone water treatment employs a special ozone water treatment apparatus (not shown) of single wafer process system and adopts the spin coating. The apparatus is designed to treat the substrate with ozone water by forming a puddle of ozone water of a predetermined concentration on the substrate spun at low speed. The ozone water treatment apparatus thus arranged performs a 60-second ozone water treatment on the surface of the amorphous silicon film 303a defining the substrate surface. Then the substrate is spin dried so as to form a ultra-thin silicon oxide film (not shown) in thickness of not more than 5 nm over the amorphous silicon film 303a. It is noted that the ultra-thin silicon oxide film (not shown) increases the wettability with the amorphous silicon film 303a when adding an aqueous solution of nickel element as the catalyst element solution by spin coating in the subsequent step. The increased wettability contributes to the suppression of a repelling phenomenon of the aqueous solution of nickel element. As a result, nickel element may uniformly be added (see FIG. 6A).

Next, the aqueous solution of nickel acetate as the catalyst element solution for accelerating crystallization is spin coated on the overall surface of the amorphous silicon film 303a (strictly, the not illustrated ultra-thin silicon oxide film). In this example, the aqueous solution of nickel acetate is prepared by dissolving nickel acetate as a Ni compound in pure water, and adjusting the concentration of the nickel compound to 10 ppm by weight. The solution is applied by spin coating based on the single wafer process system, thereby allowing a Ni containing layer (not shown) to be uniformly adhered to the overall surface of the amorphous silicon film 303a (strictly, the ultra-thin silicon oxide film). In this case, the spin coating is performed based on the single wafer process system wherein the substrates are processed in the same order as in the previous ozone water treatment (see FIG. 6A).

In the above steps wherein the amorphous silicon film 303a is treated with the ozone water and spin coated with the catalyst element, the following countermeasure is taken to eliminate the eddy pattern as the local amorphous region occurring in the subsequent step of thermal crystallization.

Specifically, at the ozone water treatment, the ozone concentration of the ozone water is measured using the ozone concentration meter attached to the apparatus for preparing ozone water. Then, an optimum wait time for the ozone concentration thus determined is calculated by substituting the ozone concentration in the relationship, Wait time=240×exp(−0.86×ozone concentration), between the ozone concentration of the ozone water and the wait time associated with the absence of local amorphous region on the thermally crystallized crystalline silicon film. The calculated wait time defines a wait time provided between the ozone water treatment and the spin coating of the catalyst element. After the lapse of the wait time, the spin coating of the catalyst element is performed. It is noted that the above relationship, Wait time=240×exp(−0.86×ozone concentration), has been obtained from the previous experiment and hence, the variations of wait time due to the errors of the relationship needed to be taken into consideration when the relationship is applied to the actual production process. Thus, the eddy pattern representative of the local amorphous region can positively be eliminated by providing such a wait time as determined by multiplying the calculated wait time by a predetermined safety factor of about 1.2 to 2, for example. In this example, a wait time determined by multiplying the calculated wait time by a safety factor of 1.5 is provided prior to the spin coating of the catalyst element.

The ozone water treatment and the spin coating of the catalyst element adopts the single wafer process system wherein the substrates are processed in the same order, so that every substrate of a lot substantially has an equal wait time. The implementation of such a countermeasure ensures that all the substrates of a lot are free from the eddy pattern representative of the local amorphous region on the thermally crystallized crystalline silicon film.

In order to control the content of hydrogen in the amorphous silicon film 303a to not more than 5 atom %, dehydrogenation of the amorphous silicon film 303a is performed by heat treating the substrate in a nitrogen atmosphere at 450° C. for 1 hour (see FIG. 6B).

Next, the amorphous silicon film 303a is crystallized by heat treating in an electric furnace at 550° C. for 1 hour, thereby forming a crystalline silicon film 303b. Because of the nickel element uniformly spin coated on the substrate without the repelling phenomenon of the catalyst element solution, the resultant crystalline silicon film 303b is free from the eddy pattern representative of the local amorphous region, accomplishing a homogenous crystalline structure in the substrate. By increasing the homogeneity of the crystalline structure in the substrate, the TFT comprising the crystalline silicon film 303b is stabilized in electrical characteristics thereof (see FIG. 6B).

Subsequently, the resultant crystalline silicon film 303b is irradiated with light from a pulse oscillator type excimer laser (wavelength: 248 nm) for improving the crystallinity thereof. Since the excimer laser is capable of not only enhancing the crystallinity of the crystalline silicon film 303b but also increasing the mobility of the nickel element in the film 303b, the excimer laser also presents an effect to enhance the efficiency of gettering with a gettering element (see FIG. 6B).

Prior to the excimer laser process, a dilute hydrofluoric acid solution is used to remove the ultra-thin silicon oxide film formed for increasing the wettability and the oxide film formed in the subsequent crystallization step. The removal of the oxide films may also be performed as treatment with dilute hydrofluoric acid solution prior to the formation of a gate insulating film (to be described hereinlater). Otherwise, the treatment with dilute hydrofluoric acid solution may be dispensed with so as to leave the oxide films as they are if there is no problem associated with the characteristics required of a device to be fabricated.

Next, the crystalline silicon film 303b is patterned by known photolithographic and dry etching processes, thereby forming semiconductor layers 304 to 308 defining TFT channel regions and source/drain regions. After the formation of the semiconductor layers 304 to 308, channel doping for doping ions of n-type or p-type impurities (B: boron or P: phosphorus) may be performed for Vth control of TFT (see FIG. 7A).

Next, a gate insulating film 309 comprised of a 100-nm silicon oxynitride film is deposited by plasma CVD process in a manner to cover the semiconductor films 304 to 308. In the deposition of the gate insulating film 309, a natural oxide film (not shown) over the semiconductor films 304 to 308 is removed with dilute hydrofluoric acid. Thereafter, a conductive film as a gate electrode material is deposited on the gate insulating film 309 by sputtering or CVD. Preferred as the gate electrode material is a heat resistant material capable of resisting temperatures of the subsequent heat treatment (in the range of 550 to 560° C.) for gettering which also serves to activate impurities. Examples of a usable heat resistant material include metals of high melting point such as Ta(tantalum), Mo(molybdenum), Ti(titanium), W(tungsten), Cr(chromium); a metal silicide which is a compound of the metal of high melting point and silicon; a polycrystal silicon having n-type or p-type conductivity, and the like. In this example, a gate electrode film 310 of W-film having a thickness of 400 nm is deposited by sputtering (see FIG. 7B).

The substrate of the above configuration is subjected to photolithographic and dry etching processes for gate electrode formation thereby to form gate electrodes 317 to 320, a capacitive electrode 321 and an electrode 322 serving as a source line. After the dry etching process, resist patterns 311 to 314, as mask for the dry etching, remain on the gate electrodes 317 to 320. Likewise, the dry etching leaves a resist pattern 315 on the capacitive electrode 321 and a resist pattern 316 on the electrode 322 as the source line. The dry etching, decreases the thickness of the underlying gate insulating film 309 of silicon oxynitride film thereby forming a gate insulating film 323 (see FIG. 8A).

Next, an ion doping system is operated to perform a first ion doping process for doping a low dose of n-type impurities using the gate electrodes 317 to 320 and capacitive electrode 321 as masks with the resist patterns 311 to 316 remaining thereon. The ion doping conditions include P(phosphorus) ions as the n-type impurities, accelerating voltage of 60 to 100 kV, and a dose of $3\times10^{12}$ to $3\times10^{13}$ ions/cm$^2$. The first ion doping process forms, in semiconductor layers 304 to 308, low-concentration impurity regions (n$^-$ regions) 329 to 333 of n-type impurities in correspondence to respective areas outside of the gate electrodes 317 to 320 and capacitive electrode 321. At the same time, formed directly under the gate electrodes 317 to 320 are substantially intrinsic regions 324 to 327 functioning as TFT channels. On the other hand, an intrinsic region 328 serving as a counterpart of capacitance forming electrodes is formed in the semiconductor layer 308 at place directly under the capacitive electrode 321 since the region in question is a place where a capacitance 405, instead of TFT, is formed (see FIG. 8A).

Next, the substrate is rinsed with a special release agent for removal of the resist patterns 311 to 316 as masks for the dry etching. Subsequent to the removal of the resist patterns, resist patterns 334 to 336 for forming n$^+$ regions, which are used as masks in a second ion doping process, are formed in a manner to cover the gate electrodes 317, 319 to 320 present at these regions (see FIG. 8B) such that LDD structures may be established at n-channel TFTs 401, 403 in a driver circuit 406 and a pixel TFT 404 in a pixel region 407.

Next, the second ion doping process is performed for doping n-type impurities at high dose. The ion doping conditions include P ions as the n-type impurities, an accelerating voltage of 60 to 100 kV, and a dose of $1.7\times10^{15}$ ions/cm$^2$. The second ion doping process forms, in the semiconductor layers 304, 306 to 307, high-concentration impurity regions (n$^+$ regions) 337, 339 to 340 of n-type impurities in correspondence to respective areas outside of the resist patterns 334 to 336. The formation of the high-concentration impurity regions (n$^+$ regions) 337, 339 to 340 divides the already formed low-concentration impurity regions (n$^-$ regions) 329, 331 to 332 into the high-concentration impurity regions (n$^+$ regions) 337, 339 to 340 and low-concentration impurity regions 342 to 344. Thus, source/drain regions defining the LDD structures are established. In this process, the other regions than the LDD structure defining regions, or the regions of a p-channel TFT 402 of the driver circuit 406 and of the capacitance 405 of the pixel region 407 are each ion-doped using the gate electrode 318 and capacitive electrode 321 as masks. Thus, a high-concentration impurity region (n$^+$ region) 338 of n-type impurities is formed in the semiconductor layer 305 in correspondence to an area outside of the gate electrode 318 whereas a high-concentration region (n$^+$ region) 341 of n-type impurities is formed in the semiconductor layer 308 in correspondence to an area outside of the capacitive electrode 321 (see FIG. 8B).

Next, a known photolithographic process is performed to form resist patterns 345 to 347 defining open regions at the semiconductor region 305 corresponding to the p-channel TFT 402 and at the semiconductor region 308 corresponding to the capacitance 405. Subsequently, the ion doping system is operated to perform a third ion doping process using the resist patterns 345 to 347 as masks, thereby doping p-type impurities at high dose. The ion doping process using the gate electrode 318 as mask dopes B ions (boron) as p-type impurities into the semiconductor layer 305 corresponding to the p-channel TFT 402. As a result, a high-concentration impurity region ($p^+$ region) 348 having p-type conductivity is formed in the semiconductor layer 305 in correspondence to an area outside of the gate electrode 318. The high-concentration impurity region ($p^+$ region) 348 has previously been doped with P ions as n-type impurities. However, B ions are doped at much higher dose ($2.5 \times 10^{15}$ ions/cm$^2$) than P ions and hence, the region is imparted with p-type conductivity to become the high-concentration impurity region ($p^+$ region) 348 functioning as the source/drain region. In the region defining the capacitance 405, as well a high-concentration impurity region ($p^+$ region) 349 having p-type conductivity is formed in the semiconductor layer 308 in correspondence to an area outside of the capacitive electrode 321 (see FIG. 9A).

After the removal of the resist patterns 345 to 347, a first interlayer insulating film 350 of silicon oxynitride film is deposited by plasma CVD process in thickness of 150 nm. Subsequently, the electric furnace is operated to perform heat treatment at 600° C. for 12 hours for thermal activation of the n-type and p-type impurities (P ions and B ions) doped into the semiconductor layers 304 to 308. Although the heat treatment is performed for thermally activating the n-type and p-type impurities, the treatment also serves the purpose of utilizing the above impurities for gettering nickel element present in the substantially intrinsic regions 324 to 327 functioning as the channel regions and in the intrinsic region 328 functioning as the counterpart of the capacitance forming electrodes. The thermal activation may be performed prior to the deposition of the first interlayer insulating film 350. However, it is more preferred to perform the thermal activation after the deposition of the first interlayer insulating film 350 in a case where a wiring material for the gate electrode and the like is low in heat resistance. Subsequently, a hydrogenation process is performed at 410° C. for 1 hour in a nitrogen atmosphere containing 3% hydrogen thereby terminating dangling bonds in the semiconductor layers 304 to 308 (see FIG. 9B).

Next, a second interlayer insulating film 351 comprised of a 1.6-μm thick acrylic resin film is laid on the first interlayer insulating film 350. Then contact holes are formed by known photolithographic and dry etching processes in a manner to extend through the second interlayer insulating film 351, the first interlayer insulating film 350 and the underlying gate insulating film 323. In these processes, the contact holes are so formed as to contact with the electrode 323 functioning as the source line and the high-concentration impurity regions 337, 339 to 340, 348 to 349 (see FIG. 10A).

Next, conductive metal wirings 352 to 357 are formed in a manner to establish electrical connection with the high-concentration impurity regions 337, 339, 348 of the driver circuit 406. On the other hand, contact electrodes 358, 360 to 361 and a gate line 359 in the pixel region 407 are formed from the same conductive material. This example employs a laminate film comprising a 50-nm thick Ti film and a 50-nm thick Al—Ti alloy film as the material for forming the metal wirings 352 to 357, contact electrodes 358, 360 to 361 and gate line 359. The contact electrode 358 is so formed as to electrically connect the impurity region 340 with the electrode 322 functioning as the source line. The contact electrode 360 is formed for electrical connection with the impurity region 340) of the pixel TFT 404, whereas the contact electrode 361 is formed for electrical connection with the impurity region 349 of the capacitance 405. On the other hand, the gate line 359 is formed for electrical connection of the plural gate electrodes 320 of the pixel TFT 404. Subsequently, a transparent conductive film such as of ITO (Indium Tin Oxide) or the like is deposited in thickness of 80 to 120 nm and then a pixel electrode 362 is formed by the photolithographic and etching processes. The pixel electrode 362 is electrically connected with the impurity region 340 as the source/drain region of the pixel TFT 404 via the contact electrode 360 and also with the impurity region 349 of the capacitance 405 via the contact electrode 361 (see FIG. 10B).

As described in the foregoing, the fabrication process of the active-matrix liquid crystal display having the n-channel TFT of LDD structure and the p-channel TFT of single drain structure ensures that the occurrence of eddy pattern representative of the local amorphous region on the thermally crystallized crystalline silicon film 303b is positively obviated by using the relationship, Wait time=240×exp(−0.86× ozone concentration), between the ozone water treatment and the spin coating of the catalyst element.

[Embodiment 2]

The present invention relates to method of manufacturing a crystalline semiconductor film containing silicon, and can be applied to manufacturing various active matrix type liquid crystal display device. Therefore, the present invention can be applied to electronic equipment comprising the active matrix liquid crystal display device as the display device of all the fields. The specific examples of the electronic equipment will be described in FIGS. 11A to 13C in this embodiment. As such electronic equipment, there are a video camera, a digital camera, a projector (rear type or front type), a head mounted display (goggle type display), a game machine, a car navigation system, a personal computer, a portable information terminal (mobile computer, mobile telephone, electronic book, and the like), and the like.

FIG. 11A shows a personal computer including a main body 1001, an image input portion 1002, a display portion 1003 and a keyboard 1004. The present invention can be applied to the display portion 1003 and another circuit.

FIG. 11B shows a video camera including a main body 1101, a display portion 1102, a voice input portion 1103, operation switches 1104, a battery 1105 and an image receiving portion 1106. The present invention can be applied to the display portion 1102 and another circuit.

FIG. 11C shows a mobile computer including a main body 1201, a camera portion 1202, an image receiving portion 1203, an operation switch 1204 and a display portion 1205. The present invention can be applied to the display portion 1205 and another circuit.

FIG. 11D shows a goggle type display including a main body 1301, a display portion 1302 and an arm portion 1303. The present invention can be applied to the display portion 1302 and another circuit.

FIG. 11E shows a player using a record medium recorded with programs (hereinafter, referred to as record medium) including a main body 1401, a display portion 1402, a speaker portion 1403, a record medium 1404 and an operation switch 1405. The player uses DVD (digital Versatile Disc), CD or the like as the record medium and can enjoy music and carry out game or Internet. The present invention can be applied to the display portion 1402 and another circuit.

FIG. 11F shows a portable telephone including a display panel 1501, an operational panel 1502, a connection portion 1503, a display portion 1504, an sound output portion 1505, an operational key 1506, a power source switch 1507, a sound input portion 1508, and an antenna 1509. The display panel 1501 and the operational panel 1502 are connected with each other through the connection portion 1503. An angle θ formed by a surface on which the display portion 1504 of the display panel 1501 is located and a surface on which the operational key 1506 of the operational panel 1502 is located can be arbitrarily changed in the connection portion 1503. The present invention can be applied to the display portion 1504.

Figure 12A:
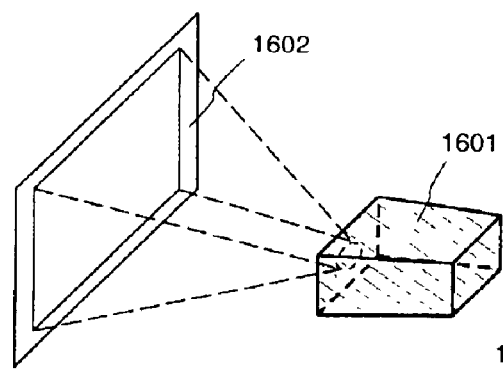
FIGS. 12A to 12D are a group of schematic diagrams showing examples of the electronic device incorporating the liquid crystal display.

FIG. 12A shows a front type projector including a light source optical system and display device 1601 and a screen 1602. The present invention can be applied to the display device 1601 and another circuit.

Figure 12B:
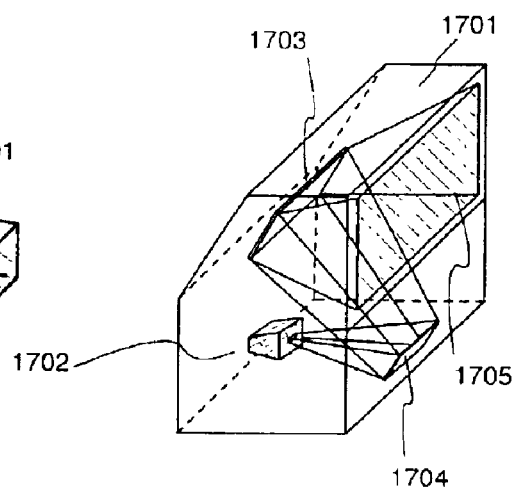

FIG. 12B shows a rear type projector including a main body 1701, a light source optical system and display device 1702, mirrors 1703 and 1704, and a screen 1705. The present invention can be applied to the display device 1702 and another circuit.

Figure 12C:
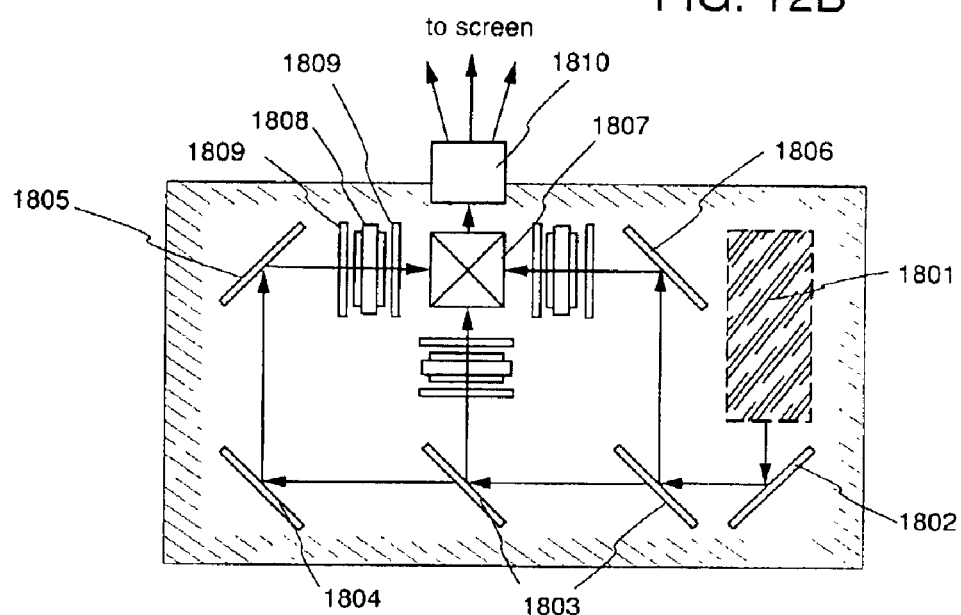

Note that FIG. 12C shows one example of a structure in the light source optical system and display device 1601 shown in FIG. 12A and the light source optical system and display device 1702 shown in FIG. 12B. Each of the light source optical system and display devices 1601 and 1702 comprises a light source optical system 1801, mirrors 1802 and 1804 to 1806, a dichroic mirror 1803, an optical system 1807, a display device 1808, a phase difference plate 1809, and a projecting optical system 1810. The projecting optical system 1810 comprises a plurality of optical lenses including a projection lens. This structure is called a three-plate type since three display devices 1808 are used. Also, in an optical path indicated by arrows in the drawing, an optical lens and a film having a polarization function, a film for adjusting a phase difference, an IR film, or the like may be suitably provided by an operator.

Figure 12D:
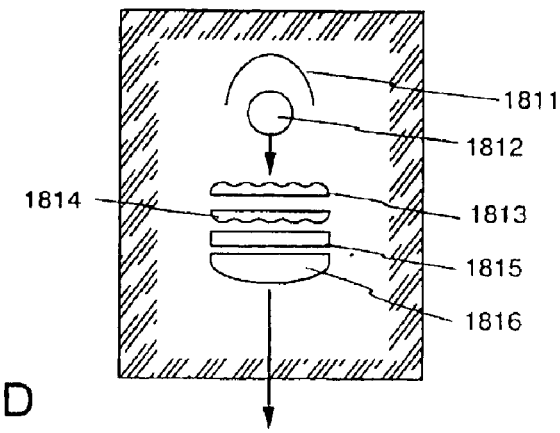

Also, FIG. 12D shows one example of a structure of the light source optical system 1801 shown in FIG. 12C. In this embodiment, the light source optical system 1801 comprises a reflector 1811, a light source 1812, lens arrays 1813 and 1814, a polarization conversion element 1815, and a condenser lens 1816. Note that the light source optical system shown in the drawing is one example and not limited to this structure. For example, an optical lens and a film having a polarization function, a film for adjusting a phase difference, an IR film, or the like may be suitably provided for the light source optical system by an operator.

Figure 13A:
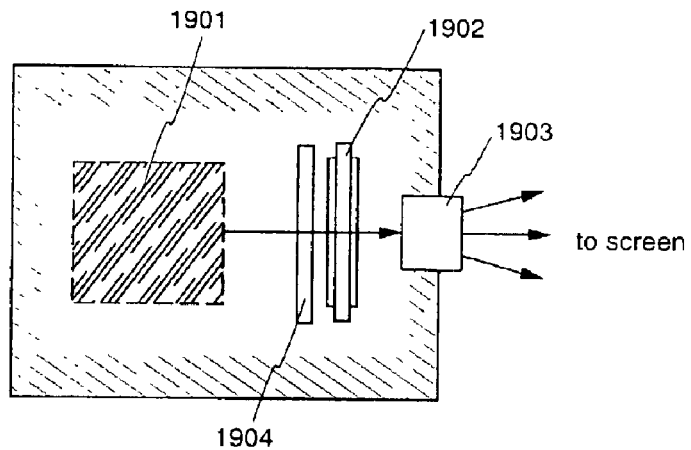
FIGS. 13A to 13C are a group of schematic diagrams showing examples of the electronic device incorporating the liquid crystal display.

Next, FIG. 13A shows an example of a single plate type. A light source optical system and display device shown in the drawing comprises a light source optical system 1901, a display device 1902, a projecting optical system 1903, and a phase difference plate 1904. The projecting optical system 1903 comprises a plurality of optical lenses including a projection lens. The light source optical system and display device shown in the drawing can be applied to the light source optical system and display devices 1601 and 1702 shown in FIGS. 12A and 12B. Also, the light source optical system shown in FIG. 12D may be used as the light source optical system 1901. Note that color filters (not shown) are provided in the display device 1902, and a display image is thus colored.

Figure 13B:
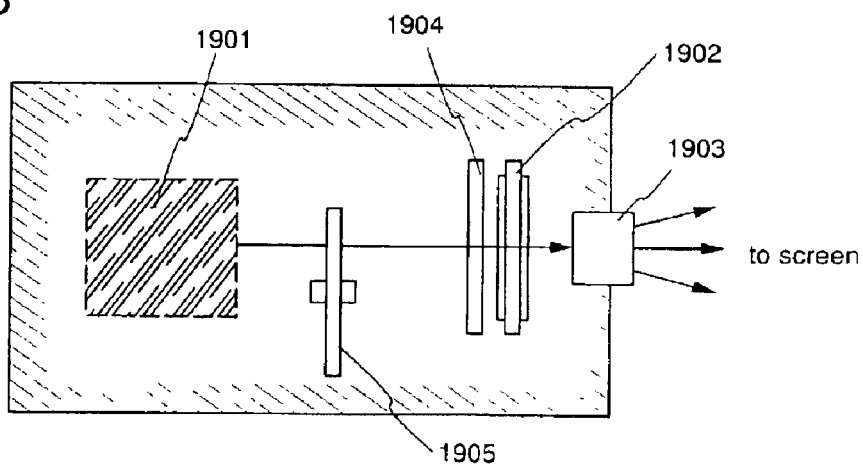

Also, a light source optical system and display device shown in FIG. 13B is an application example of that shown in FIG. 13A. Instead of providing color filters, a display image is colored using a rotatory RGB color filter circular plate 1905. The light source optical system and display device shown in the drawing can be applied to the light source optical system and display devices 1601 and 1702 shown in FIGS. 12A and 12B.

Figure 13C:
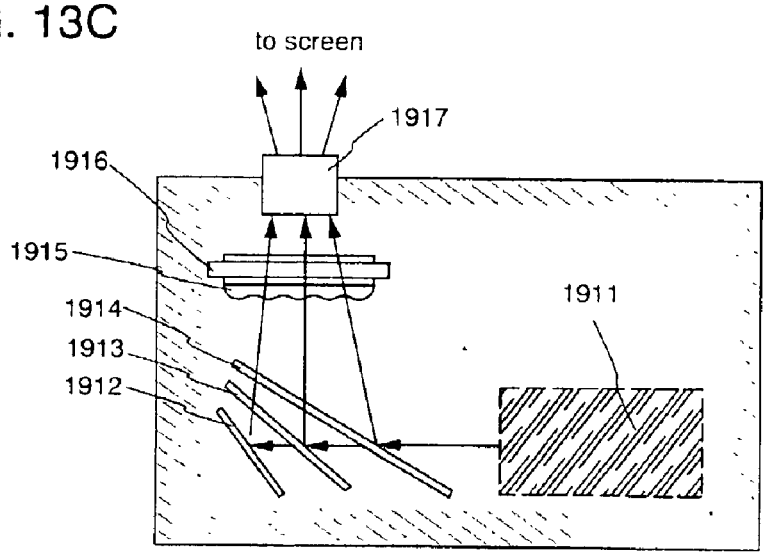

Also, a light source optical system and display device shown in FIG. 13C is called a color filterless single plate type. With respect to this type, a micro lens array 1915 is provided in a display device 1916 and a display image is colored using a dichroic mirror (green) 1912, a dichroic mirror (red) 1913, and a dichroic mirror (blue) 1914. A projecting optical system 1917 comprises a plurality of optical lenses including a projection lens. The light source optical system and display device shown in the drawing can be applied to the light source optical system and display devices 1601 and 1702 shown in FIGS. 12A and 12B. Also, an optical system using a coupling lens and a collimator lens in addition to a light source may be used as a light source optical system 1911.

As described above, the range of applying the method of manufacturing the crystalline semiconductor film of the present invention is extremely wide and is applicable to manufacturing the electronic equipment comprising an active matrix type liquid crystal display device of all the fields.

The invention relates to the method for forming the silicon-containing crystalline semiconductor film and more particularly to the countermeasures against the local amorphous region occurring on the thermally crystallized crystalline semiconductor film. Main effects of the invention are described as below.

(Effect 1)

Increasing homogeneity in the silicon-containing crystalline semiconductor film because the thermally crystallized silicon-containing crystalline semiconductor film is positively prevented from suffering the local amorphous region observed as the eddy pattern.

(Effect 2)

Improving the quality of TFT formed from the silicon-containing crystalline semiconductor film by virtue of the increased homogeneity in the silicon-containing crystalline semiconductor film obtained by thermal crystallization.

(Effect 3)

Contributing to the reduction of initial plant investment because the ozone water treatment apparatus provides for the construction of a production line allowing for the variations in the ozone concentration.

What is claimed is:

1. A method for forming a crystalline semiconductor film, comprising:

depositing en amorphous semiconductor film comprising silicon over a substrate;

performing an ozone water treatment for forming a ultra-thin oxide film on a surface of the amorphous semiconductor film;

adding a catalyst element for accelerating a crystallization of the amorphous semiconductor film to the surface of the amorphous semiconductor film formed with the oxide film thereon; and performing a heat treatment to form a crystalline semiconductor film, wherein the method further comprises:

calculating an ozone concentration of the ozone water;

determining a wait time between the ozone water treatment step and the catalyst element addition step by substituting the ozone concentration in a relationship, wait time=240×exp(−0.86×ozone concentration); and providing a wait time at least not shorter than the calculated wait time between the ozone water treatment step and the catalyst element addition step.

2. The method for forming a crystalline semiconductor film according to claim 1, wherein the ozone water treatment step and the catalyst element addition step are performed based on a single wafer process system processing substrates in a same order, thereby providing all the substrates of a lot with substantially an equal time interval between the ozone water treatment step and the catalyst element addition step.

3. The method for forming a crystalline semiconductor film according to claim 1, wherein the catalyst element is added in a form of an aqueous solution containing one or more kinds of elements selected from the group consisting of Fe, Co, Ni, Ru, Rh, Pd, Os, Ir, Pt, Cu and Au.

4. The method for forming a crystalline semiconductor film according to claim 1, wherein the catalyst element is added by a spin coating, a roller coating, a spray coating or a shower coating a solution which contains the catalyst element.

5. A method for forming a crystalline semiconductor film according to claim 1, the crystalline semiconductor film is used in at least one selected from the group consisting of a personal computer, a video camera, a mobile computer, a goggle type display; a player using a record medium, a portable telephone, and a projector.

6. A method for forming a crystalline semiconductor film, comprising:
  depositing an amorphous semiconductor film comprising silicon over a substrate;
  performing an ozone water treatment for forming a ultra-thin oxide film on a surface of the amorphous semiconductor film;
  adding a catalyst element for accelerating a crystallization of the amorphous semiconductor film to the surface of the amorphous semiconductor film formed with the oxide film thereon; and
  performing a heat treatment to form a crystalline semiconductor film,
  wherein an ozone concentration of the ozone water corresponding to a given wait time between the ozone water treatment step and the catalyst element addition step is calculated by substituting the given wait time in a relationship, wait time=$240 \times \exp(-0.86 \times \text{ozone concentration})$, and
the ozone concentration of the ozone water is adjusted to a level at least not smaller than the calculated concentration.

7. The method for forming a crystalline semiconductor film according to claim 6, wherein the ozone water treatment step and the catalyst element addition step are performed based on a single wafer process system processing substrates in a same order, thereby providing all the substrates of a lot with substantially an equal time interval between the ozone water treatment step and the catalyst element addition step.

8. The method for forming a crystalline semiconductor film according to claim 6, wherein the catalyst element is added in a form of an aqueous solution containing one or more kinds of elements selected from the group consisting of Fe, Co, Ni, Ru, Rh, Pd, Os, Ir, Pt, Cu and Au.

9. The method for forming a crystalline semiconductor film according to claim 6, wherein the catalyst element is added by a spin coating, a roller coating, a spray coating or a shower coating a solution which contains the catalyst element.

10. A method for forming a crystalline semiconductor film according to claim 6, wherein the crystalline semiconductor film is used in at least one selected from the group consisting of a personal computer, a video camera, a mobile computer, a goggle type display, a player using a record medium, a portable telephone, and a projector.

11. A method for forming a crystalline semiconductor film, comprising:
  depositing an amorphous semiconductor film comprising silicon over a substrate;
  depositing a mask insulating film on the amorphous semiconductor film and forming an open region at a portion of the mask insulating film:
  performing an ozone water treatment for forming a ultra-thin oxide film on the open region of the mask insulating film,
  adding a catalyst element for accelerating a crystallization of the amorphous semiconductor film to the open region of the mask insulating film; and
  performing a heat treatment to form a crystalline semiconductor film,
  wherein a given wait time is provided between the ozone water treatment step and the catalyst element addition step.

12. The method for forming a crystalline semiconductor film according to claim 11, wherein the ozone water treatment step and the catalyst element addition step are performed based on a single wafer process system processing substrates in a same order, thereby providing all the substrates of a lot with substantially an equal time interval between the ozone water treatment step and the catalyst element addition.

13. The method performing a crystalline semiconductor film according to claim 11, wherein the catalyst element is added in a form of an aqueous solution containing one or more kinds of elements selected from the group consisting of Fe, Co, Ni, Ru, Rh, Pd, Os, Ir, Pt, Cu and Au.

14. The method for forming a crystalline semiconductor film according to claim 11, wherein the catalyst element is added by a spin coating, a roller coating, a spray coating or a shower coating a solution which contains the catalyst element.

15. A method for forming a crystalline semiconductor film according to claim 11, wherein the crystalline semiconductor film is used in at least one selected from the group consisting of a personal computer, a video camera, a mobile computer, a goggle type display, a player using a record medium, a portable telephone, and a projector.

16. A method for forming a crystalline semiconductor film, comprising:
  depositing an amorphous semiconductor film comprising silicon over a substrate;
  depositing a mask insulating film on the amorphous semiconductor film and forming an open region at a portion of the mask insulating film;
  performing an ozone water treatment for forming a ultra-thin oxide film on the open region of the mask insulating film;
  adding a catalyst element for accelerating a crystallization of the amorphous semiconductor film to the open region of the mask insulating film; and
  performing a heat treatment to form a crystalline semiconductor film,
  wherein the method farther comprises:
  determining an ozone concentration of the ozone water;
  calculating a wait time between the ozone water treatment step and the catalyst element addition step by substituting the ozone concentration in a relationship, wait time=$240 \times \exp(-0.86 \times \text{ozone concentration})$; and
  providing a wait time at least not shorter than the calculated wait time between the ozone water treatment step and the catalyst element addition step.

17. The method for forming a crystalline semiconductor film according to claim 16, wherein the ozone water treatment step and the catalyst element addition step are performed based on a single wafer process system processing substrates in a same order, thereby providing all the substrates of a lot with substantially an equal time interval between the ozone water treatment step and the catalyst element addition.

18. The method for forming a crystalline semiconductor film according to claim 16, wherein the catalyst element is added in a form of an aqueous solution containing one or more kinds of elements selected from the group consisting of Fe, Co, Ni, Ru, Rh, Pd, Os, Ir, Pt, Cu and Au.

19. The method performing a crystalline semiconductor film according to claim 16, wherein the catalyst element is added by a spin coating, a roller coating, a spray coating or a shower coating a solution which contains the catalyst element.

20. A method for forming a crystalline semiconductor film according to claim 16, wherein the crystalline semiconductor film is used in at least one selected from the group consisting of a personal computer, a video camera, a mobile computer, a goggle type display, a player using a record medium, a portable telephone, and a projector.

21. A method for forming a crystalline semiconductor film, comprising:

depositing an amorphous semiconductor film comprising silicon over substrate;

depositing a mask insulating film on the amorphous semiconductor film and forming an open region at a portion of the mask insulating film;

performing an ozone water treatment for forming a ultra-thin oxide film on the open region of the mask insulating film;

adding a catalyst element for accelerating a crystallization of the amorphous semiconductor film to the open region of the mask insulating film; and performing a heat treatment to form a crystalline semiconductor film, wherein a given wait time is defined between the ozone water treatment step and the catalyst element addition step, an ozone concentration of the ozone water is calculated by substituting the given wait time in a relationship, wait time (min)=240×exp(−0.86×ozone concentration), and the ozone concentration of the ozone water is adjusted to a level at least not smaller than the calculated concentration.

22. The method for forming a crystalline semiconductor film according to claim 21, wherein the ozone water treatment step and the catalyst element addition step are performed based on a single wafer process system processing substrates in a same order, thereby providing all the substrates of a lot with substantially an equal time interval between the ozone water treatment step and the catalyst element addition.

23. The method for forming a crystalline semiconductor film according to claim 21, wherein the catalyst element is added in a form of an aqueous solution containing one or more kinds of elements selected from the group consisting of Fe, Co, Ni, Ru, Rh, Pd, Os, Ir, Pt, Cu and Au.

24. The method for forming a crystalline semiconductor film according to claim 21, wherein the catalyst element is added by a spin coating, a roller coating, a spray coating or a shower coating a solution which contains the catalyst element.

25. A method for forming a crystalline semiconductor film according to claim 21, wherein the crystalline semiconductor film is used in at least one selected from the group consisting of a personal computer, a video camera, a mobile computer, a goggle type display, a player using a record medium, a portable telephone, and a projector.

* * * * *